United States Patent
Su et al.

(10) Patent No.: US 9,238,576 B2
(45) Date of Patent: Jan. 19, 2016

(54) COMPOSITE MICRO-ELECTRO-MECHANICAL-SYSTEM APPARATUS AND MANUFACTURING METHOD THEREOF

(71) Applicant: Industrial Technology Research Institute, Hsinchu (TW)

(72) Inventors: Chung-Yuan Su, Taichung (TW); Chao-Ta Huang, Hsinchu (TW); Tzung-Ching Lee, Hsinchu County (TW); Yu-Wen Hsu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/149,833

(22) Filed: Jan. 8, 2014

(65) Prior Publication Data

US 2014/0284603 A1 Sep. 25, 2014

(30) Foreign Application Priority Data

Mar. 25, 2013 (TW) .............................. 102110526 A

(51) Int. Cl.
*G01P 15/097* (2006.01)
*B81B 3/00* (2006.01)
*H03H 3/007* (2006.01)

(52) U.S. Cl.
CPC ............ *B81B 3/0008* (2013.01); *G01P 15/097* (2013.01); *H03H 3/0072* (2013.01); *B81B 2201/0271* (2013.01)

(58) Field of Classification Search
CPC ... G01P 15/0802; G01P 15/125; G01P 15/18; G01P 15/123; G01P 15/097; G01C 19/56; G01C 19/5621; G01C 19/5656; H03H 3/0072; H03H 3/0076; H03H 9/02338; H03H 9/2473; H03H 9/2447; H03H 9/02448; H03H 9/2457; H03H 9/2405

USPC ............... 73/504.12, 504.14, 504.16, 504.04, 73/514.16, 514.29, 514.32, 497; 29/594, 29/59, 592.1, 25.355; 333/187, 189
See application file for complete search history.

(56) References Cited

U.S. PATENT DOCUMENTS 4,836,025 A * 6/1989 Mihara ........................... 73/497
5,913,244 A * 6/1999 Heinouchi ...................... 73/662
(Continued)

FOREIGN PATENT DOCUMENTS

| | | |
|---|---|---|
| CN | 101495836 | 7/2009 |
| CN | 101765776 | 6/2010 |
| EP | 0791832 | 8/1997 |

OTHER PUBLICATIONS

Samarao et al., "Temperature Compensation of Silicon Micromechanical Resonators via Degenerate Doping," IEEE Transactions on Electron Devices, Dec. 7-9, 2009, pp. 1-4.
(Continued)

*Primary Examiner* — Helen Kwok
(74) *Attorney, Agent, or Firm* — Jianq Chyun IP Office

(57) ABSTRACT

A MEMS apparatus comprising composite vibrating unit and the manufacturing method thereof are disclosed. The vibrating unit includes a stiffness element on which a first material is disposed. A second material being a conductive material is disposed on the first material and is extended to the stiffness element to remove electric charge on first material. When a temperature is changed, a variation direction of a Young's modulus of the first material is opposite to a variation direction of a Young's modulus of the stiffness element. The unique attributes above allow vibrating unit of the MEMS apparatus such as resonator and gyroscope to have stable resonance frequency against the change of temperature.

21 Claims, 38 Drawing Sheets

(56) References Cited

U.S. PATENT DOCUMENTS

| | | |
|---|---|---|
| 6,987,432 B2 | 1/2006 | Lutz et al. |
| 7,071,793 B2 | 7/2006 | Lutz et al. |
| 7,202,761 B2 | 4/2007 | Lutz et al. |
| 7,362,197 B2 | 4/2008 | Lutz et al. |
| 7,514,853 B1 | 4/2009 | Howe et al. |
| 7,639,104 B1 | 12/2009 | Quevy et al. |
| 7,824,098 B2 * | 11/2010 | Melamud et al. ............. 374/117 |
| 7,847,649 B2 | 12/2010 | Van Beek et al. |
| 7,889,030 B2 | 2/2011 | Schoen et al. |
| 7,944,124 B1 | 5/2011 | Bernstein |
| 8,234,774 B2 | 8/2012 | Hagelin et al. |
| 2008/0204173 A1 | 8/2008 | Melamud et al. |
| 2009/0133497 A1 * | 5/2009 | Fujimoto et al. ........... 73/504.12 |
| 2009/0158566 A1 | 6/2009 | Hagelin et al. |
| 2009/0160581 A1 | 6/2009 | Hagelin et al. |
| 2010/0093125 A1 | 4/2010 | Quevy et al. |
| 2010/0218607 A1 * | 9/2010 | Kazama et al. ............ 73/514.33 |
| 2010/0319185 A1 | 12/2010 | Ayazi et al. |
| 2011/0084781 A1 | 4/2011 | Quevy et al. |
| 2011/0127625 A1 | 6/2011 | van der Avoort et al. |
| 2011/0279201 A1 | 11/2011 | Pensala et al. |
| 2012/0001700 A1 | 1/2012 | Lander |
| 2012/0006113 A1 * | 1/2012 | Zolfagharkhani et al. . 73/504.12 |
| 2012/0013412 A1 | 1/2012 | Winkler et al. |
| 2014/0224018 A1 * | 8/2014 | Whitesides et al. ....... 73/514.33 |

OTHER PUBLICATIONS

Hsu et al., "Stiffness-Compensated Temperature-Insensitive Micromechanical Resonators," The Fifteenth IEEE International Conference on Micro Electro Mechanical Systems, Jan. 20-24, 2002, pp. 731-734.

Hsu et al., "Mechanically Temperature-Compensated Flexural-Mode Micromechanical Resonators," Technical Digest, IEEE Int. Electron Devices Meeting, Dec. 11-13, 2000, pp. 399-402.

Melamud et al., "Temperature-Insensitive Composite Micromechanical Resonators," Journal of Microelectromechanica L Systems 18 (6), Dec. 2009, pp. 1409-1419.

Ho et al., "Low-motional-impedance highly-tunable I2 resonators for temperature-compensated reference oscillators," 18th IEEE International Conference on Micro Electro Mechanical Systems, Jan. 30-Feb. 3, 2005, pp. 116-120.

"Office Action of Chinese Counterpart Application", issued on Oct. 10, 2015, p. 1-p. 9.

* cited by examiner

COMPOSITE MICRO-ELECTRO-MECHANICAL-SYSTEM APPARATUS AND MANUFACTURING METHOD THEREOF

CROSS-REFERENCE TO RELATED APPLICATION

This application claims the priority benefit of Taiwan application serial no. 102110526, filed on Mar. 25, 2013. The entirety of the above-mentioned patent application is hereby incorporated by reference herein and made a part of this specification.

TECHNICAL FIELD

The disclosure relates to composite micro-electro-mechanical-system (MEMS) apparatus and a manufacturing method thereof.

BACKGROUND

Owing to the development of electronic products, such as smart phones, tablet computers, and motion sensing gaming machines, and integration of electronic products, wireless communication, and broadband network, micro-electro-mechanical-system (MEMS) inertial sensors, e.g. accelerometer, gyroscope, and oscillator, became extensively used in these electronic products and the demand for MEMS inertial sensors has increased significantly in these years. The environments where the MEMS inertial sensors are used are subject to significant temperature change. The current trend is to develop an MEMS inertial sensor adaptable to different environment temperatures.

FIG. 1A is a simplified schematic view of a vibrating unit of an accelerometer. FIG. 1B is a simplified schematic view of a vibrating unit of an oscillator. Referring to FIG. 1A and FIG. 1B, these MEMS inertial sensor may be simplified as a vibrating unit composed of a flexure and a mass.

The resonance frequency of the vibrating unit can be obtained by the following equation:

$$f = \frac{1}{\sqrt{2\pi}}\sqrt{\frac{k}{m}}$$

wherein f represents the resonance frequency of the vibrating unit, k represents the stiffness of the stiffness element, and m represents the mass of the mass. That is, the resonance frequency of the vibrating unit is determined by two important factors, i.e. the stiffness of the stiffness element and the mass of the mass.

The definition of the stiffness element is specified below. Among the elements of the vibrating unit, one can be defined as the stiffness element if the stiffness thereof is a critical factor for determining the resonance frequency of the vibrating unit. More specifically, in the aforementioned equation for calculating the resonance frequency of the vibrating unit, the stiffness parameter (k) is determined by the stiffness element.

Thus, in the accelerometer of FIG. 1A, the vibrating unit 10 is composed of a flexure 12 (spring) and a mass 14. The resonance frequency of the vibrating unit 10 is mainly determined by the stiffness of the flexure 12 and the mass of the mass 14. Therefore, in the accelerometer of FIG. 1A, the flexure 12 can be defined as the stiffness element.

In the oscillator of FIG. 1B, the vibrating unit 10a is a beam-shaped mass 12a and the resonance frequency of the vibrating unit 10a is mainly determined by the stiffness of the beam-shaped mass 12a and the mass of the beam-shaped mass 12a. Therefore, in the oscillator of FIG. 1B, the beam-shaped mass 12a can be defined as the stiffness element.

It can be known from the above that the stiffness of the stiffness element has a significant effect on the resonance frequency of the vibrating unit. The material properties, e.g. Young's modulus, of the stiffness element of the conventional MEMS inertial sensor are subject to change with the temperature, which may change the stiffness of the stiffness element and the resonance frequency of the vibrating unit, and consequently cause the obtained sensing value to be inaccurate. A variation of the Young's modulus due to temperature change may be represented by a temperature coefficient of Young's modulus (TCE). More specifically, the temperature coefficient of Young's modulus (TCE) may be defined as: the variation of the Young's modulus in a temperature unit.

FIG. 2 is a diagram showing the variation of a resonance frequency of a vibrating unit under different temperatures. When the resonance frequency of the vibrating unit changes with the change of temperature, the degree of change of the resonance frequency may be represented by a temperature coefficient of frequency (TCf), as shown in FIG. 2. Likewise, the temperature coefficient of frequency (TCf) may be specifically defined as: the variation of the resonance frequency in a temperature unit. When the resonance frequency of the vibrating unit does not change with the temperature, the temperature coefficient of frequency (TCf) of the vibrating unit is 0, which is called zero TCf.

FIG. 3 is a simplified schematic view of a micro-electro-mechanical-system (MEMS) resonator. Referring to FIG. 3, a stiffness element 22 of the MEMS resonator 20 is a beam-shaped mass. The stiffness element 22 is connected to an anchor 26 by a flexure 24 and driven by a driving electrode 28a to generate a periodical oscillation. When the beam-shaped mass reaches the state of resonance, the beam-shaped mass has the greatest amplitude of oscillation and the sensing electrode 28b senses the biggest voltage change, and the MEMS resonator 20 outputs the frequency of the measured voltage change as a clock signal. At the same time, the material properties, e.g. Young's modulus, of the stiffness element 22 change with the temperature, which changes the stiffness and the resonance frequency of the stiffness element 22 (beam-shaped mass). Consequently, the clock signal also changes with the temperature.

FIG. 4 is a simplified schematic view of a micro-electro-mechanical-system (MEMS) accelerometer. Referring to FIG. 4, when an MEMS accelerometer 30 is accelerated in the Y axis direction, a mass 34 that is connected to the anchor 26 by a stiffness element 32 (e.g. spring) is translated in the Y axis direction, and a relative distance between a stationary electrode 36a and a movable electrode 36b is changed due to the displacement of the mass 34. To be more specific, the change of the relative distance between the stationary electrode 36a and the movable electrode 36b results in change of capacitance between the stationary electrode 36a and the movable electrode 36b. Accordingly, the MEMS accelerometer 30 senses the capacitance change to calculate the acceleration. At the same time, the material properties, e.g. Young's modulus, of the stiffness element 32 change with the temperature, which changes the stiffness of the stiffness element 32. Thus, under the environments of different temperatures, the same acceleration excites the mass 34 of the MEMS accelerometer 30 to translate with different displacements and causes the capacitance change to be different. As a result, the acceleration value measured by the MEMS accelerometer 30 is inaccurate.

FIG. 5 is a simplified schematic view of a micro-electro-mechanical-system (MEMS) gyroscope. Referring to FIG. 5, a stiffness element 42 (spring) of the MEMS gyroscope 40 connects a frame 44a with a mass 44b and the stiffness element 42 (spring) of the MEMS gyroscope 40 connects a frame 44a and an anchor. The frame 44a oscillates along the Y axis direction at the resonance frequency thereof to drive the mass 44b to oscillate along the Y axis direction. When an angular velocity is applied in the Z axis direction, the mass 44b is translated in the X axis. Thus, a relative distance between a stationary electrode 46a and a movable electrode 46b changes. To be more specific, the change of the relative distance between the stationary electrode 46a and the movable electrode 46b results in change of capacitance between the stationary electrode 46a and the movable electrode 46b. Accordingly, the MEMS gyroscope 40 senses the capacitance change to calculate the angular velocity. At the same time, the material properties, e.g. Young's modulus, of the stiffness element 42 change with the temperature, which changes the stiffness of the stiffness element 42 and causes the resonance frequency of the peripheral frame 44a to change. Therefore, under the environments of different temperatures, the mass 44b has different displacements in the X axis direction and causes the capacitance change to be different when the same angular velocity in the Z axis direction is applied on the MEMS gyroscope 40. As a result, the angular velocity value measured by the MEMS gyroscope 40 is inaccurate.

From aforesaid examples, an issue in the development of MEMS inertial sensors, the current trend is to design an MEMS resonator having constant resonance frequency, an MEMS gyroscope having constant resonance frequency, or an MEMS accelerometer having constant spring stiffness even under different temperatures.

FIG. 6 is a simplified schematic view of a passive temperature compensated micro-electro-mechanical-system (MEMS) oscillator. Referring to FIG. 6, which discloses a passive temperature compensated MEMS oscillator 50, wherein SiO2 56 is filled into the trench 54 of the Si mass 52, so as to form the oscillating element (mass 52) with materials of two different Young's moduli. The Young's moduli of the two materials change with the temperature, and the variation of one of the Young's moduli is positive while the variation of another one is negative. Therefore, the resonance frequency of the MEMS oscillator 50 does not change with the temperature.

FIG. 7 is a simplified schematic view of another temperature compensated micro-electro-mechanical-system (MEMS) oscillator. Referring to FIG. 7, which discloses a composite MEMS oscillator 60, wherein four exterior surfaces of the Si oscillating element 62 are covered by SiO2 64 (see the cross-sectional view at the lower right corner of FIG. 7), so as to form the oscillating element 62 with materials of different Young's moduli. The Young's moduli of the two materials change with the temperature. Therefore, the resonance frequency of the MEMS oscillator 60 does not change with the temperature.

Further to the above, a paper "Temperature-Insensitive Composite Micromechanical Resonators" discloses an equation, as below, for calculating the temperature coefficient of frequency (TCf) of a composite resonator provided with a beam-shaped mass:

$$TCf = \frac{r \cdot TCf_1 + TCf_2}{r+1} \quad \text{(Equation 1)}$$

$$r = \frac{m_1 \cdot f_1^2}{m_2 \cdot f_2^2} = \frac{E_1 \cdot I_1}{E_2 \cdot I_2} \quad \text{(Equation 2)}$$

$$TCf_1 = \frac{TCE_1 + \alpha_1}{2} \quad \text{(Equation 3)}$$

$$TCf_2 = \frac{TCE_2 + \alpha_2}{2} \quad \text{(Equation 4)}$$

where E1 represents the Young's modulus of the mass, E2 represents the Young's modulus of the covering material, I1 represents the area moment of inertia of the mass, I2 represents the area moment of inertia of the covering material, TCf represents the temperature coefficient of frequency of the composite resonator, TCf1 represents the temperature coefficient of frequency of the mass, TCf2 represents the temperature coefficient of frequency of the covering material, TCE1 represents the temperature coefficient of Young's modulus of the mass, TCE2 represents the temperature coefficient of Young's modulus of the covering material, α1 represents the thermal expansion coefficient of the mass, α2 represents the thermal expansion coefficient of the covering material, f1 represents the resonance frequency of the mass, f2 represents the resonance frequency of the covering material, m1 represents the mass of the mass, and m2 represents the mass of the covering material.

The paper also discloses that, in order to prevent the resonance frequency of the composite resonator from changing with the temperature, the temperature coefficient of frequency (TCf) of the composite resonator has to be zero TCf. Based on the deduction below:

$$TCf = \frac{r \cdot TCf_1 + TCf_2}{r+1} = 0 \quad \text{(Equation 5)}$$

$$r = -\frac{TCf_2}{TCf_1}.$$

It is known from the above that the composite vibrating unit in the common passive temperature compensated MEMS oscillator is formed by using a silicon material and the first material (e.g. SiO2). In the case where the variation direction of the Young's modulus of the first material is opposite to the variation direction of the Young's modulus of the silicon material when the temperature changes, and the area moment of inertia of the mass of the composite resonator and the area moment of inertia of the covering material satisfy Equation 2 and Equation 5, the stiffness of the stiffness element (beam-shaped mass) in the oscillating direction remains unchanged, and the resonance frequency of the beam-shaped mass does not change with the temperature. As a result, the clock signal generated by the oscillator does not change with temperature.

SUMMARY

The disclosure provides a composite MEMS apparatus, including a vibrating unit, a first material, and a second material. The vibrating unit is configured to oscillate along a first axis, wherein the vibrating unit includes a stiffness element. The stiffness element includes a first surface, a second surface, and a third surface, wherein the first surface faces toward a first direction of the first axis and the second surface faces toward a second direction of the first axis, which is opposite to the first direction, and the third surface is connected with the first surface and the second surface. The first material is disposed on the first surface and the second surface of the stiffness element. The second material is a conductive material, which is disposed on the first material and extends to the stiffness element, so that the second material is electrically connected to the stiffness element, wherein a variation direction of a Young's modulus of the first material is opposite to a variation direction of a Young's modulus of the stiffness element when temperature changes.

The disclosure further provides a composite MEMS apparatus, including a vibrating unit, a first material, and a second material. The vibrating unit includes a mass and a flexure. The mass is a stiffness element and configured to oscillate along a first axis, wherein the mass includes a first surface, a second surface, and a third surface, wherein the first surface faces toward a first direction of the first axis and the second surface faces toward a second direction of the first axis, which is opposite to the first direction, and the third surface is connected with the first surface and the second surface. The flexure is connected with the mass. The first material is disposed on the first surface and the second surface of the mass. The second material is a conductive material, which is disposed on the first material and extends to the mass, so that the second material is electrically connected to the mass, wherein a variation direction of a Young's modulus of the first material is opposite to a variation direction of a Young's modulus of the mass when temperature changes.

The disclosure further provides a composite MEMS apparatus, including a vibrating unit, a first material, and a second material. The vibrating unit includes a mass and a flexure. The mass is configured to oscillate along a first axis. The flexure is a stiffness element and connected with the mass. The flexure includes a span and a connector connected to the span, wherein the span includes a first surface, a second surface, and a third surface. The first surface faces toward a first direction of the first axis and the second surface faces toward a second direction of the first axis, wherein the first direction is opposite to the second direction, and the third surface is connected with the first surface and the second surface. The first material is disposed on the first surface and the second surface. The second material is a conductive material, which is disposed on the first material and extends to the flexure, so that the second material is electrically connected to the flexure, wherein a variation direction of a Young's modulus of the first material is opposite to a variation direction of a Young's modulus of the flexure when temperature changes.

The disclosure further provides a manufacturing method for manufacturing a composite micro-electro-mechanical-system (MEMS) apparatus, and the manufacturing method includes the following steps: A first substrate is provided, wherein the first substrate includes at least one device layer, an insulation layer, and a handle layer. The device layer is etched by using a patterned hard mask, so as to form a plurality of first trenches to expose a portion of a surface of the insulation layer. After removing the patterned hard mask, a first material is deposited on the device layer to form a first material layer conformal with the device layer, wherein the first material is at least formed on an inner side of each first trench. A second material is deposited on the device layer to fill the first trenches, in which the second material in the first trenches is surrounded by the first material layer. The device layer is polished to remove the second material and to remove the first material outside the first trenches. The second material is deposited to form a second material layer which connects the second material filled in the first trenches. A second substrate is provided and a recess is formed on the second substrate. The first substrate and the second substrate are bonded to each other, wherein the device layer of the first substrate faces to the recess of the second substrate. A portion of the second material layer in the first trenches is removed to form slots penetrating the device layer, so as to form a mass of a vibrating unit of the composite MEMS apparatus, wherein the first material layer is arranged on a first surface and a second surface of the mass, and the second material layer is a conductive material which is arranged on the first material and extends to a third surface of the mass, in which the second material is electrically connected to the mass.

The disclosure further provides a manufacturing method for manufacturing a composite micro-electro-mechanical-system (MEMS) apparatus, and the manufacturing method includes the following steps: a first substrate is provided, wherein the first substrate includes a device layer, an insulation layer, and a handle layer. The device layer is etched by using a patterned hard mask, so as to form a plurality of first trenches which expose portion of a surface of the insulation layer. After removing the patterned hard mask, a first material is deposited on the device layer to form a first material layer which is conformal with the device layer, wherein the first material is at least formed on an inner side of each first trench. A second material is deposited on the device layer to fill the first trenches, in which the second material in the first trenches is surrounded by the first material layer. The device layer is polished to remove the second material and to remove the first material outside the first trenches. The second material is deposited to form a second material layer which connects the second material filled in the first trenches. A second substrate is provided and a recess is formed on the second substrate. The first substrate and the second substrate are bonded to each other, wherein the device layer of the first substrate faces to the recess of the second substrate. A portion of the second material layer in the first trenches is removed to form slots penetrating the device layer.

Based on the above, the composite MEMS apparatus provided in the disclosure includes the vibrating unit that oscillates along the first axis, wherein the mass or the span of the flexure, serving as the stiffness element, of the vibrating unit has the first surface and the second surface that are arranged along the first axis, and the first material is disposed on the first surface and the second surface to adjust the overall temperature coefficient of the frequency of the vibrating unit. The second material is disposed on the first material and the third surface that connects the first surface and the second surface. Thus, the composite MEMS apparatus has high stability and high accuracy. In addition, the manufacturing method for manufacturing the composite MEMS apparatus, provided in the disclosure, includes sequentially depositing the first material and the second material on the first substrate, and bonding the first substrate to the second substrate with the recesses, so as to form the mass of the vibrating unit of the composite MEMS apparatus.

Several exemplary embodiments accompanied with figures are described in detail below to further describe the disclosure.

BRIEF DESCRIPTION OF THE DRAWINGS

The accompanying drawings are included to provide further understanding, and are incorporated in and constitute a part of the specification. The drawings illustrate exemplary embodiments and, together with the description, serve to explain the principles of the disclosure.

DETAILED DESCRIPTION OF DISCLOSED EMBODIMENTS

Figure 8:
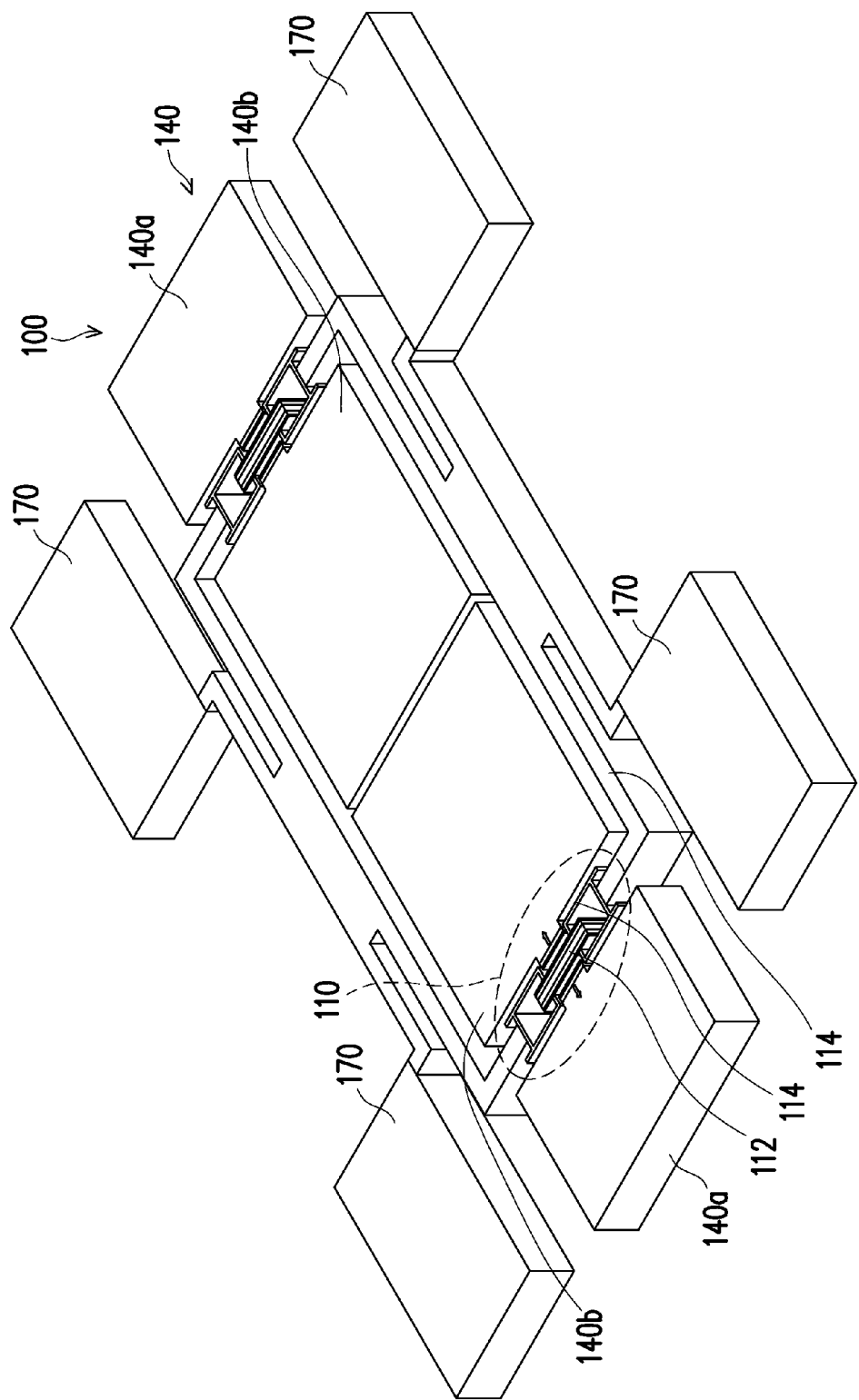
FIG. 8 is a simplified schematic view of a composite micro-electro-mechanical-system (MEMS) device according to first one of exemplary embodiments of the disclosure.
Figure 9:
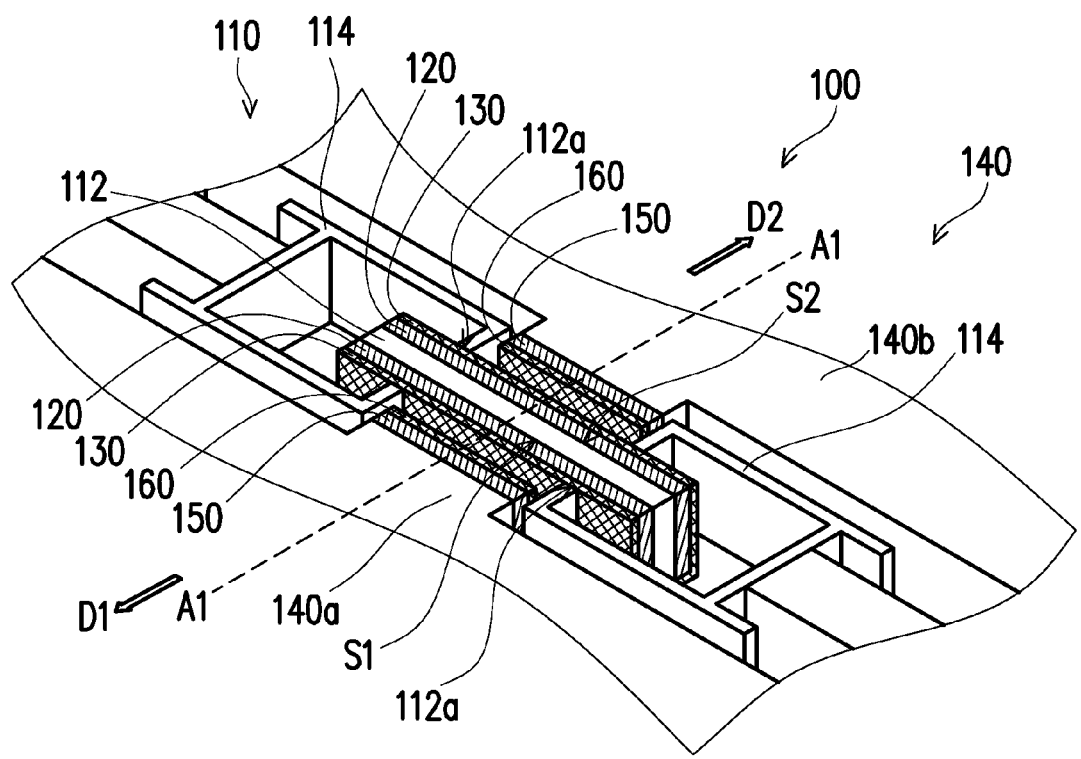
FIG. 9 is a partial enlarged view of the composite micro-electro-mechanical-system (MEMS) device of FIG. 8.
Figure 10:
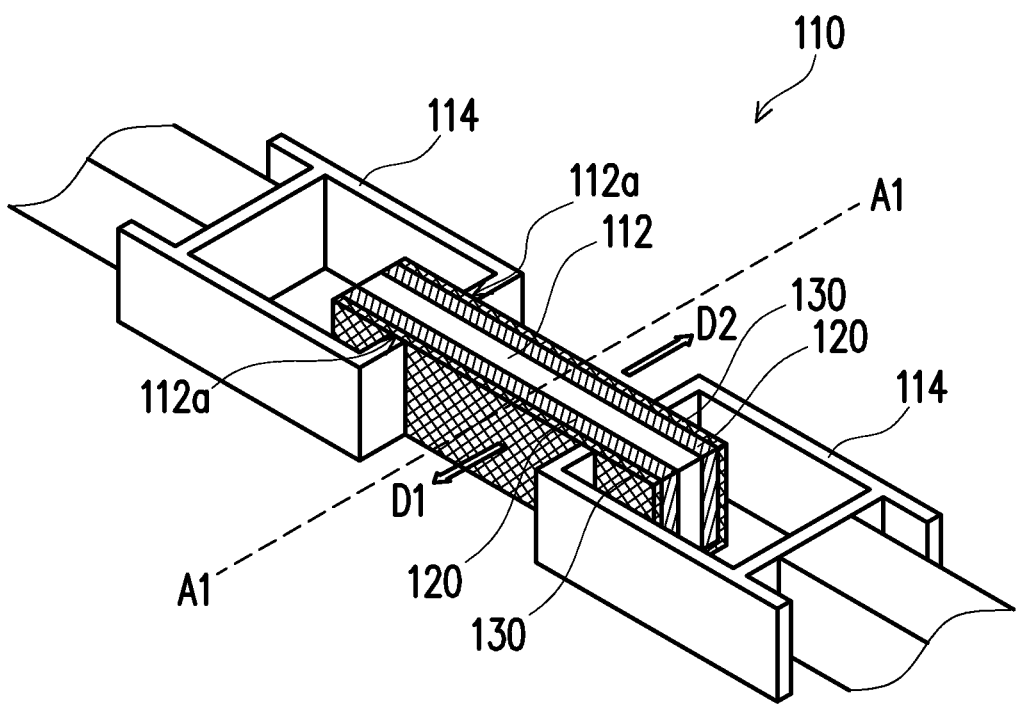
FIG. 10 is a simplified schematic view of a vibrating unit of FIG. 9.

FIG. 8 is a simplified schematic view of a composite micro-electro-mechanical-system (MEMS) device according to first one of exemplary embodiments of the disclosure. FIG. 9 is a partial enlarged view of the composite MEMS device of FIG. 8. FIG. 10 is a simplified schematic view of a vibrating unit of FIG. 9. Referring to FIGS. 8 to 10, in the embodiment, a composite micro-electro-mechanical-system (MEMS) device 100 includes a vibrating unit 110, a first material 120, a second material 130, an electrode 140, a third material 150, a fourth material 160, and an anchor 170. In the embodiment, the composite MEMS device 100 may be an MEMS resonator.

In the embodiment, the vibrating unit 110 includes a mass 112 and a flexure 114. The flexure 114 is connected to the anchor 170 and a node 112a of the mass 112, wherein the node 112a is a position where the vibrating unit 110, formed of the mass 112, the first material 120, and the second material 130, does not have a displacement when vibrating unit 110 vibrates at a resonance frequency (or called natural frequency) thereof. The vibrating unit 110 is configured to oscillate along a first axis A1, wherein the vibrating unit 110 includes a stiffness element and the stiffness element may serve as the mass of an oscillator. In the embodiment, the stiffness of the mass of the oscillator significantly affects the resonance frequency of the vibrating unit 110. Therefore, the stiffness element is the mass 112 in the embodiment, which oscillates along the first axis A1. In the embodiment, a material of the mass 112 may be Si. In addition, the electrode 140 is disposed beside two sides of the mass 112 along the first axis A1. The electrode 140 includes a driving electrode 140a and a sensing electrode 140b. The mass 112 is driven by the driving electrode 140a to oscillate along the first axis A1, in which the sensing electrode 140b senses a capacitance change.

Figure 11A:
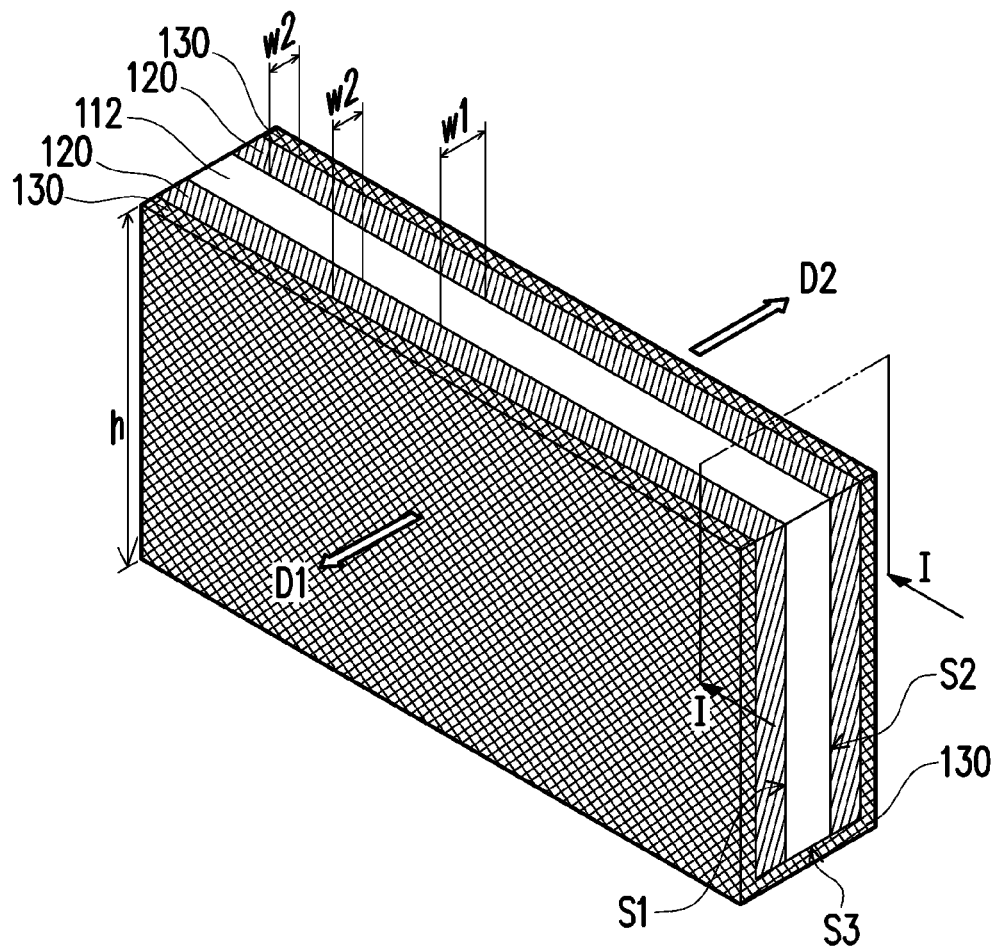
FIG. 11A is a simplified schematic view of a mass of FIG. 10.
Figure 11B:
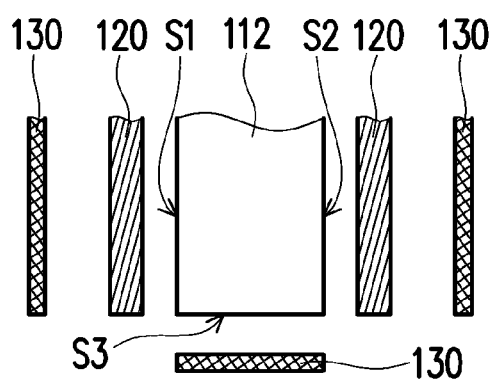
FIG. 11B is a lateral exploded view of the mass of FIG. 11A.

FIG. 11A is a simplified schematic view of the mass of FIG. 10. FIG. 11B is a lateral exploded view of the mass of FIG. 11A. With reference to FIGS. 9 to 11B, in the embodiment, the mass 112, as the stiffness element, includes a first surface S1, a second surface S2, and a third surface S3. The first surface S1 faces toward a first direction D1 of the first axis A1 and the second surface S2 faces toward a second direction D2 of the first axis A1, wherein the first direction D1 is opposite to the second direction D2, and the third surface S3 is connected with the first surface S1 and the second surface S2. In other words, the first surface S1 and the second surface S2 face to two opposite directions of the first axis A1. The first material 120 is disposed on the first surface S1 and the second surface S2 of the mass 112 that serves as the stiffness element, wherein the first material 120 includes SiO2, but the disclosure is not limited thereto. When the temperature changes, a variation direction of a Young's modulus of the first material 120 is opposite to a variation direction of a Young's modulus of the mass 112 serving as the stiffness element, so as to adjust a temperature coefficient of the frequency (TCf) of the vibrating unit 110. Specifically, the temperature coefficient of the frequency (TCf) (shown in FIG. 2) of the vibrating unit 110 is related to the temperature coefficient of the frequency (TCf) of the first material 120 and the mass 112 (such as equation 1), which are related to the temperature coefficient of the Young's modulus (TCE) thereof (such as equation 3 and 4). The temperature coefficient of the Young's modulus (TCE) may be defined as the variation of the Young's modulus in a temperature unit. Consequently, when TCE is positive, it means that the Young's modulus is increasing when temperature is increasing or that the Young's modulus is decreasing when temperature is decreasing. Similarly, when TCE is negative, it means that the Young's modulus is decreasing when temperature is increasing or that the Young's modulus is increasing when temperature is decreasing. In the present disclosure, the variation direction of the Young's modulus can be defined positive when TCE is positive or variation direction of the Young's modulus can be defined negative when TCE is negative. In the case that "the variation direction of the Young's modulus of the first material 120 is opposite to the variation direction of the Young's modulus of the mass 112" can be considered as TCE of the first material 120 is positive and TCE of the mass 112 is negative or can be considered as TCE of the first material 120 is negative and TCE of the mass 112 is positive. Hence, the temperature coefficient of the frequency (TCf) of the vibrating unit 110 can be adjusted when the variation direction of the Young's modulus of the first material 120 is opposite to the variation direction of the Young's modulus of the mass 112.

Figure 1A:
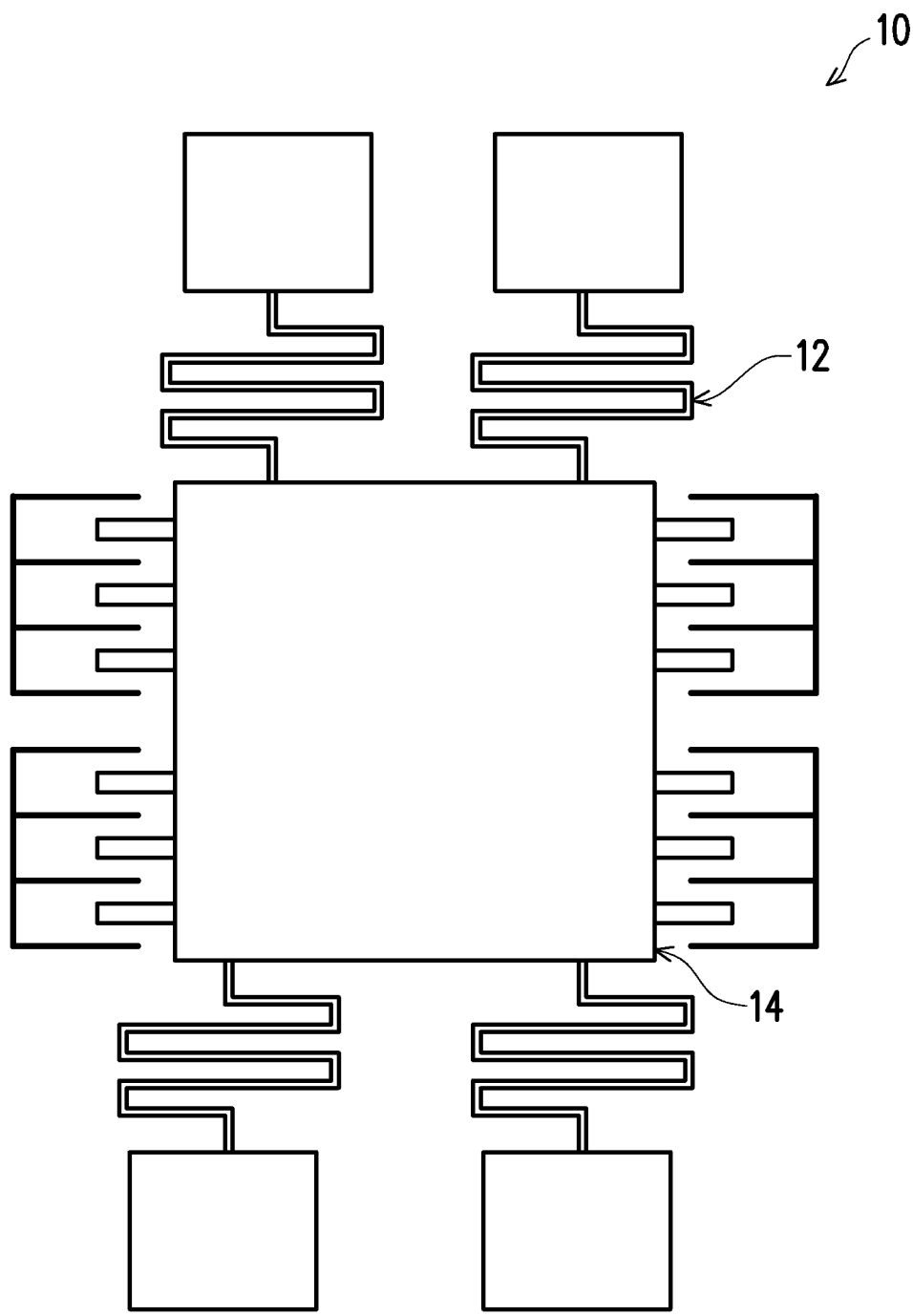
FIG. 1A is a simplified schematic view of a vibrating unit of an accelerometer.
Figure 1B:
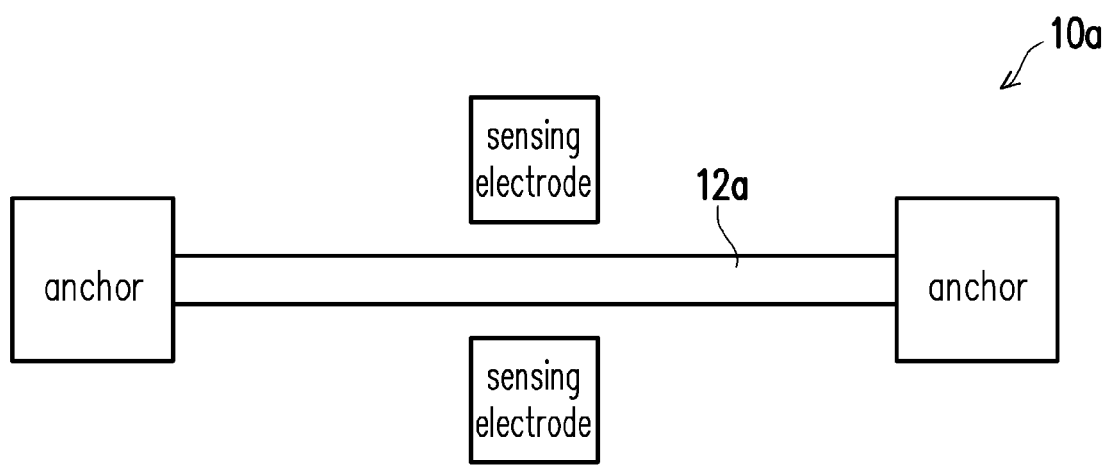
FIG. 1B is a simplified schematic view of a vibrating unit of an oscillator.
Figure 2:
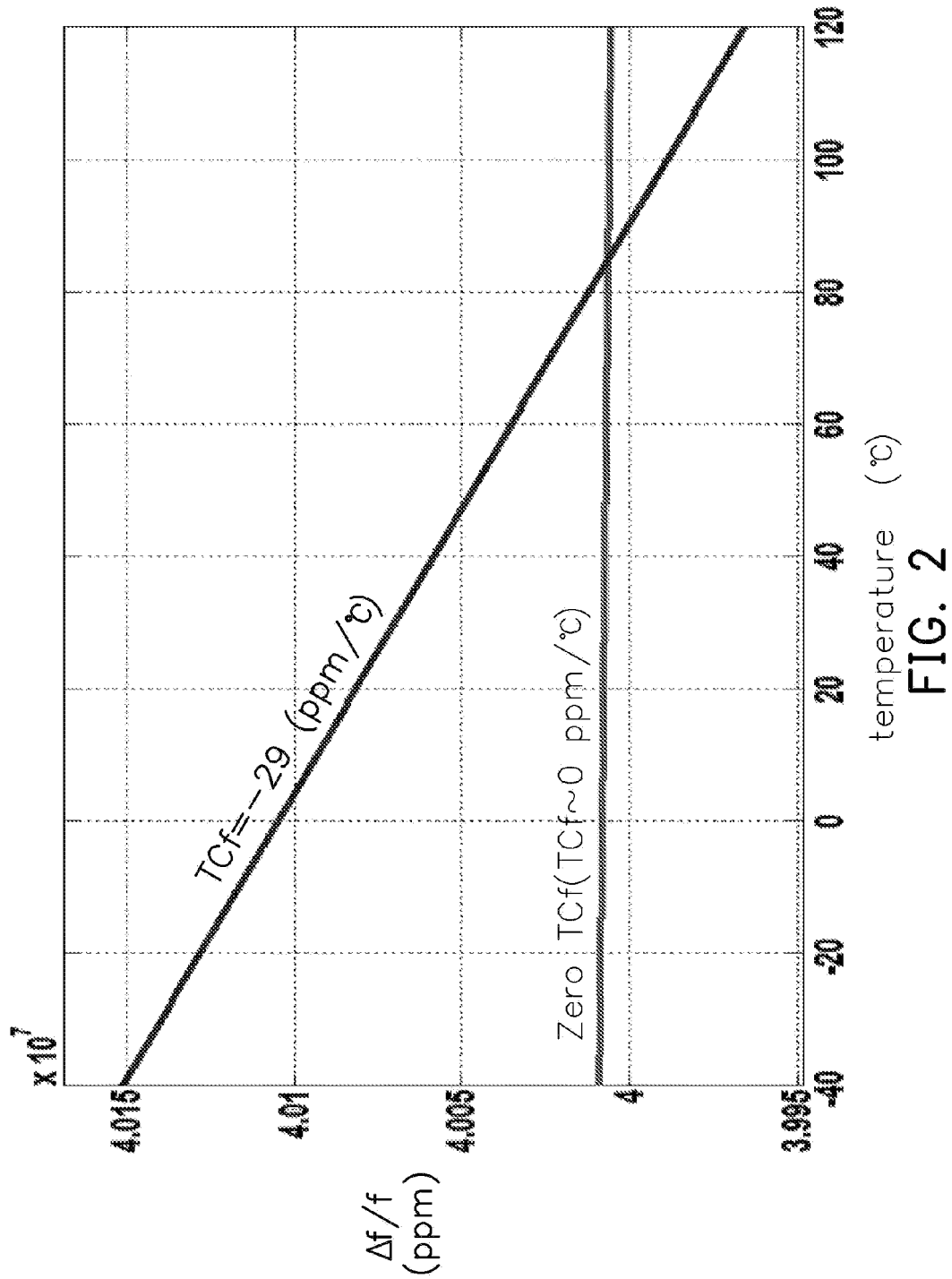
FIG. 2 is a diagram showing the variation of a resonance frequency of a vibrating unit under different temperatures.
Figure 3:
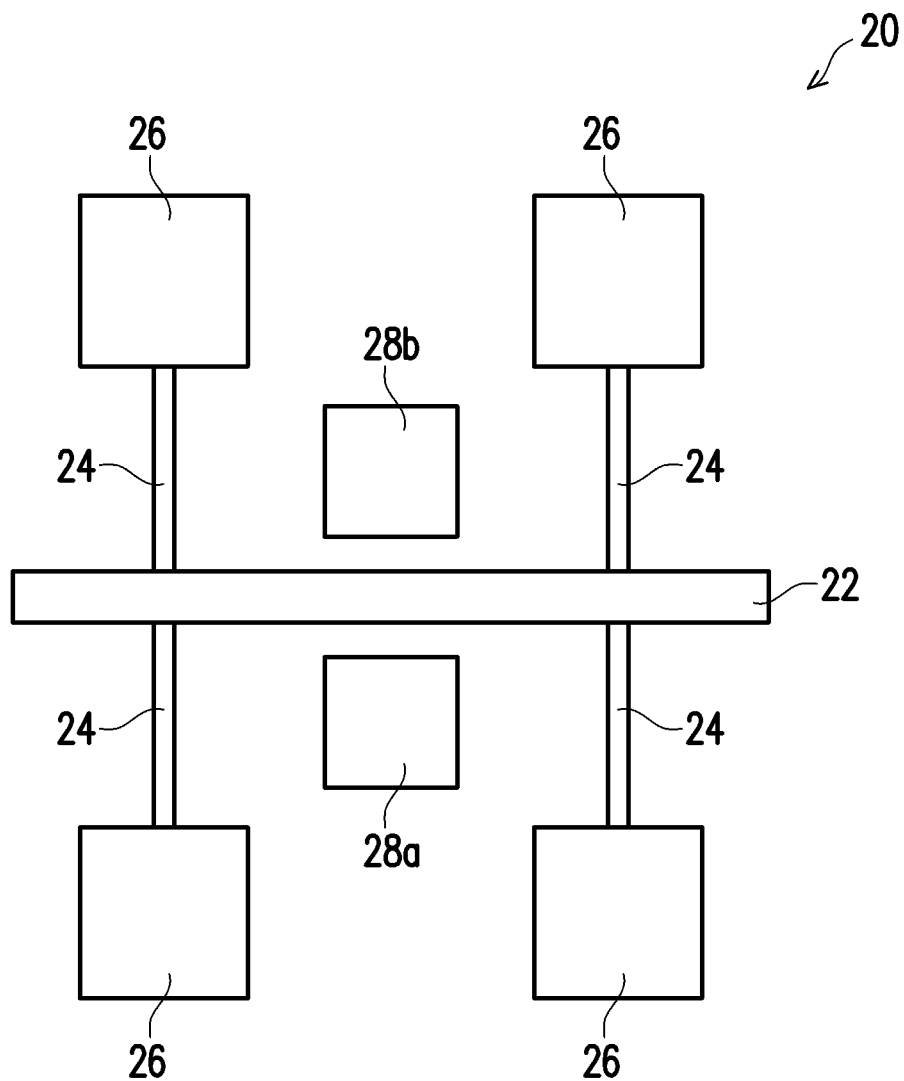
FIG. 3 is a simplified schematic view of a micro-electro-mechanical-system resonator.
Figure 4:
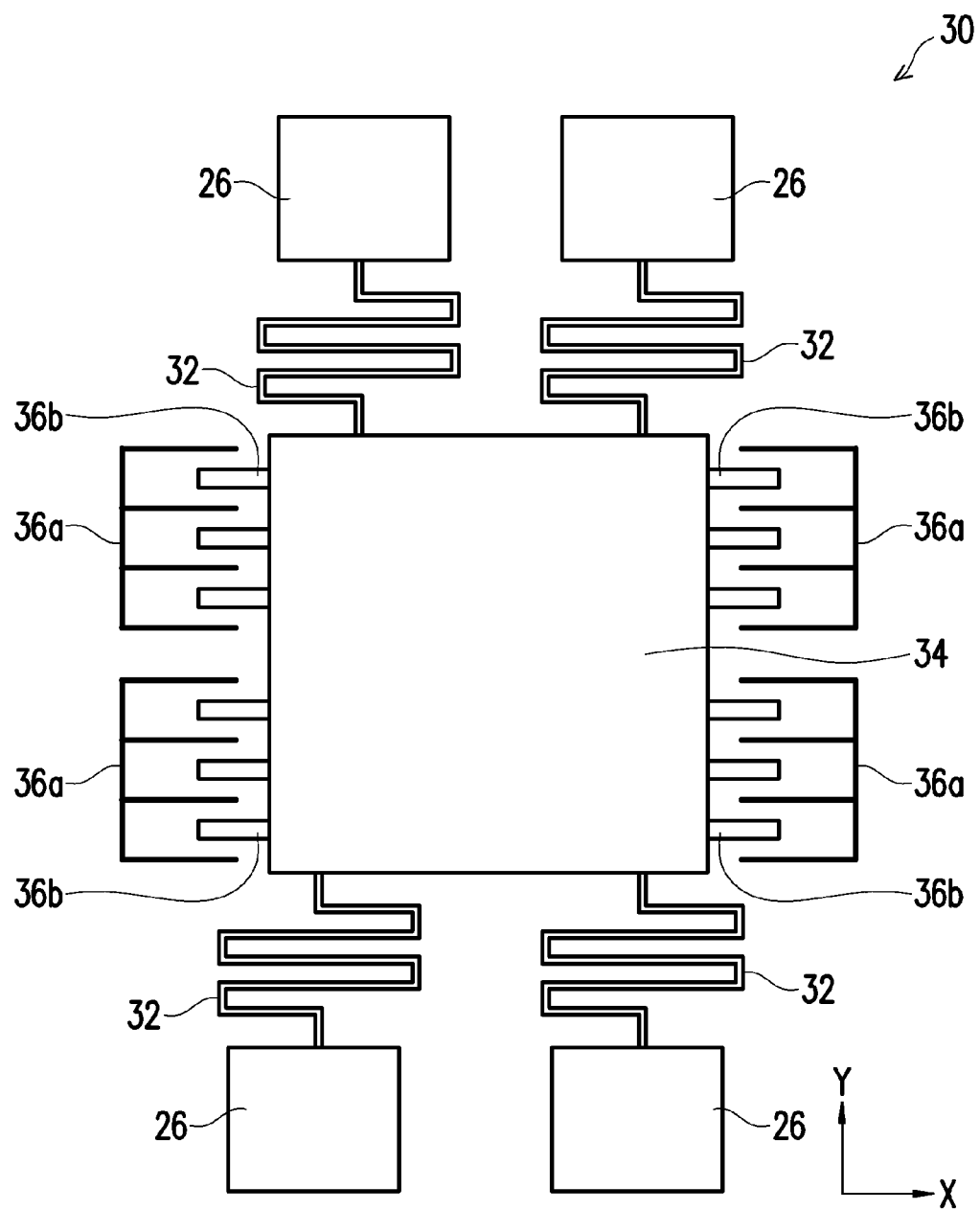
FIG. 4 is a simplified schematic view of a micro-electro-mechanical-system accelerometer.
Figure 5:
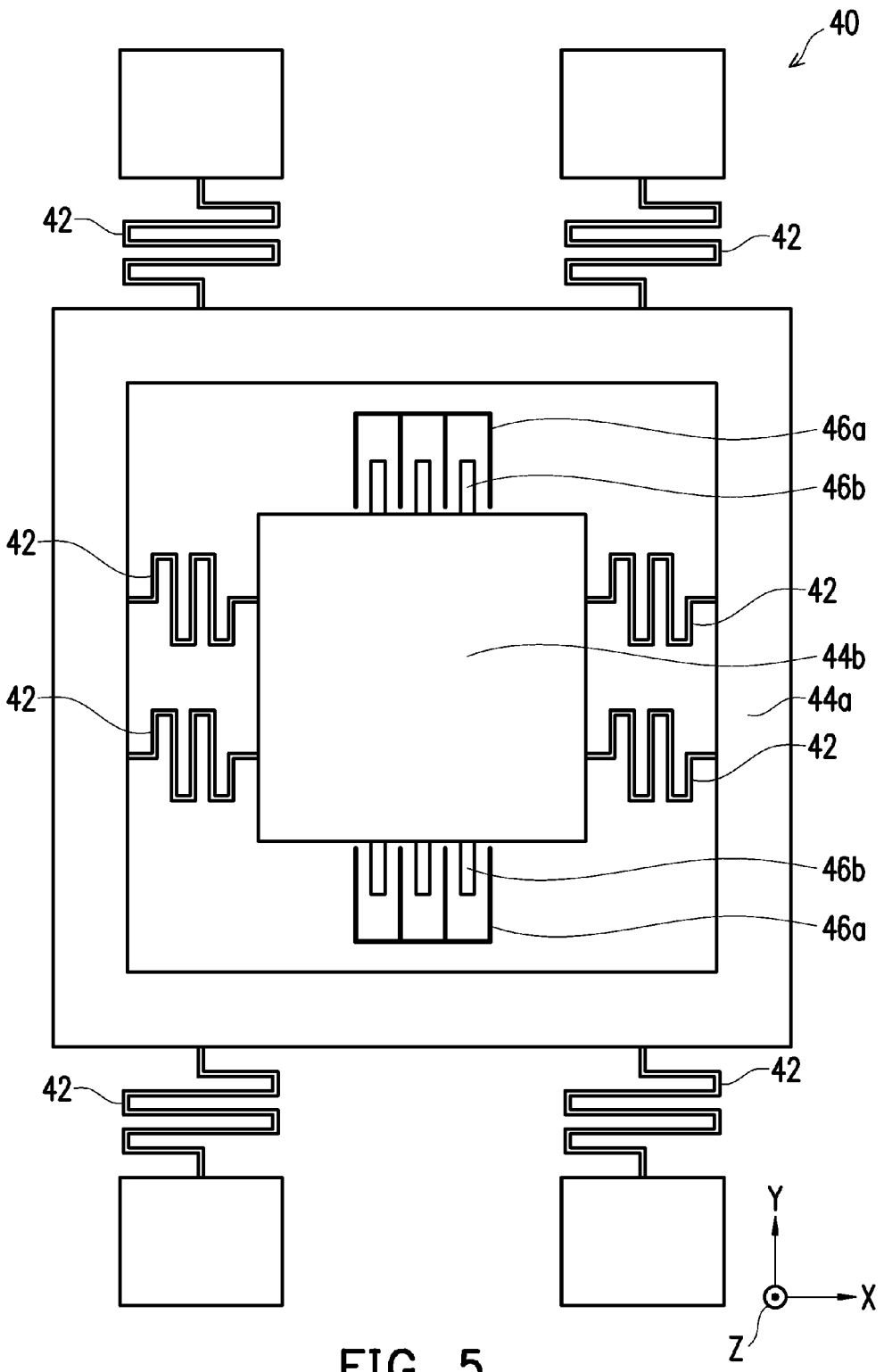
FIG. 5 is a simplified schematic view of a micro-electro-mechanical-system gyroscope.
Figure 6:
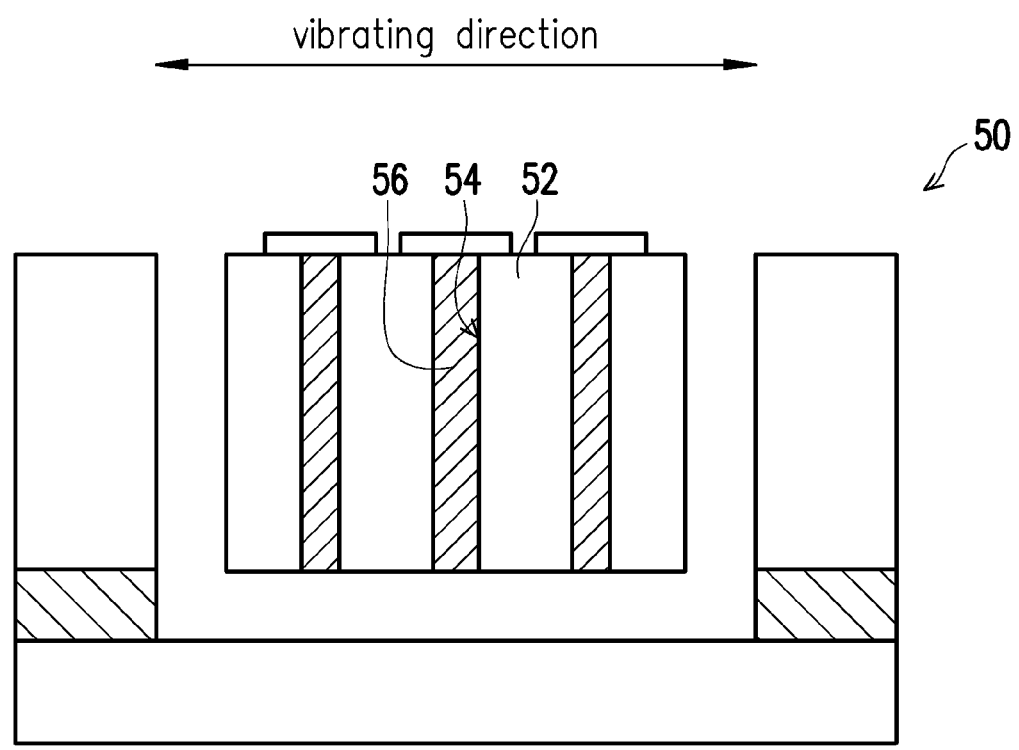
FIG. 6 is a simplified schematic view of a passive temperature compensated micro-electro-mechanical-system oscillator.
Figure 7:
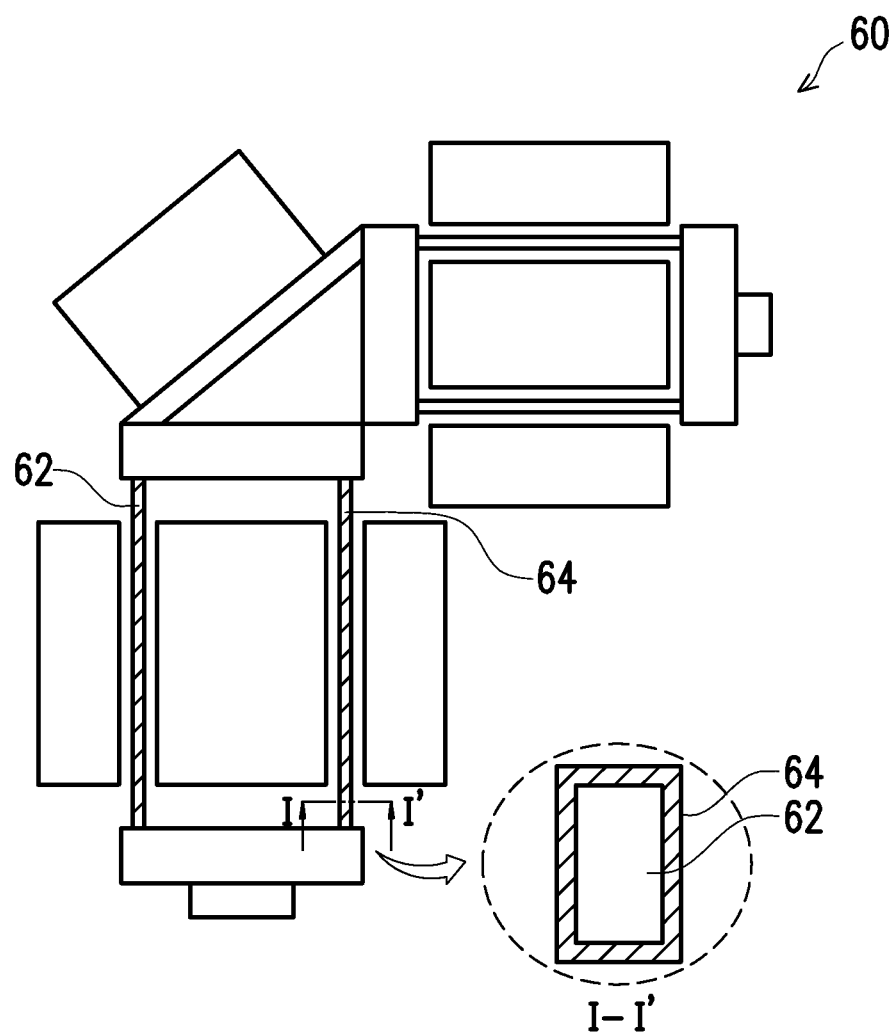
FIG. 7 is a simplified schematic view of another temperature compensated micro-electro-mechanical-system oscillator.

Further, in the composite MEMS device 100 used as the MEMS resonator in the embodiment, the first material 120 covers the entirety of the first surface S1 and the second surface S2, wherein the mass 112 has a section width w1, and the first material 120 has a section width w2 as shown in FIG. 11A. The first material 120 is disposed on the first surface S1 and the second surface S2 of the mass 112 serving as the stiffness element, which faces toward a vibrating direction (the first axis A1). In order to prevent the resonance frequency of the vibrating unit 110 from changing with the temperature, the temperature coefficient of frequency (TCf) of the vibrating unit 110 has to be zero TCf, as shown in FIG. 2. Referring to FIG. 11A, the temperature coefficient of frequency (TCf) of the vibrating unit 110 is zero TCf only when an area moment of inertia of the mass 112 and an area moment of inertia of the first material 120 satisfy Equation (2) and Equation (5). It is known from Equation (2), Equation (3), Equation (4), and Equation (5) that:

$$r = \frac{E_1 \cdot I_1}{E_2 \cdot I_2} = -\frac{TCE_2 + \alpha_2}{TCE_1 + \alpha_1}. \quad \text{Equation (6)}$$

It is known from Equation (6) that:

$$\frac{I_1}{I_2} = -\frac{E_2}{E_1}\left(\frac{TCE_2 + \alpha_2}{TCE_1 + \alpha_1}\right). \quad \text{Equation (7)}$$

That is, in FIG. 11A, the resonance frequency of the vibrating unit 110 does not change with the temperature only when the area moment of inertia of the mass 112 and the area moment of inertia of the first material 120 satisfy Equation (7). The aforementioned description indicates that the section width w1 of the mass 112 and the section width w2 of the first material 120 in FIG. 11A are not chosen arbitrarily. And, the resonance frequency of the vibrating unit 110 does not change with the temperature only when the section width w1 of the mass 112 and the section width w2 of the first material 120 both satisfy Equation (7).

Referring to FIG. 11A, the area moment of inertia of the mass 112 and the area moment of inertia of the first material 120 are respectively represented by Equation (8) and Equation (9) below (h represents a height of the mass 112):

$$I_1 = \frac{h \cdot w_1^3}{12} \quad \text{Equation (8)}$$

$$I_2 = 2 \cdot \left[\frac{h \cdot w_2^3}{12} + h \cdot w_2 \cdot \left(\frac{w_1}{2}\right)^2\right]. \quad \text{Equation (9)}$$

According to the disclosure, after Equation (8) and Equation (9) are substituted into Equation (7), Equation (10), for limiting the section width w1 of the mass 112 and the section width w2 of the first material 120, is established.

$$\frac{w_1^3}{6w_1^2 \cdot w_2 + 2w_2^3} = -\frac{E_2}{E_1}\left(\frac{TCE_2 + \alpha_2}{TCE_1 + \alpha_1}\right) \quad \text{Equation (10)}$$

In Equation (10), because the Young's modulus E1, the temperature coefficient of Young's modulus TCE1, and a thermal expansion coefficient α1 of the mass 112 and the Young's modulus E2, the temperature coefficient of Young's modulus TCE2, and a thermal expansion coefficient α2 of the first material 120 are all constants under a specific temperature T, Equation (11) is derived from Equation (10):

$$\frac{w_1^3}{6w_1^2 \cdot w_2 + 2w_2^3} = C_T \quad \text{Equation (11)}$$

wherein, $$C_T = -\frac{E_2}{E_1}\left(\frac{TCE_2 + \alpha_2}{TCE_1 + \alpha_1}\right) \quad \text{Equation (12)}$$

and $C_T$ is a temperature constant which is a constant at a specific temperature T. Equation (11) and Equation (12) show that the temperature coefficient of frequency (TCf) of the vibrating unit 110 is zero TCf only when the section width w1 of the mass 112 and the section width w2 of the first material 120 both satisfy the Equation (11). In other words, when the variation direction of the Young's modulus of the mass 112 is opposite to the variation direction of the Young's modulus of the first material 120, both the section width w1 of the mass 112 and the section width w2 of the first material 120 have to satisfy the Equation (11), so as to adjust the temperature coefficient of the overall frequency of the vibrating unit 110 to be zero TCf and consequently the resonance frequency of the vibrating unit 110 does not change with the temperature.

With reference to FIG. 11A, in the embodiment, a material of the mass 112 may be Si, and the first material 120 may be SiO2. Material properties of Si and SiO2 at the temperature of 85° C. are provided below:
E1 represents the Young's modulus of Si: 169×103 Mpa
E2 represents the Young's modulus of SiO2: 66×103 Mpa
TCE1 represents the temperature coefficient of Young's modulus of Si: −84.66 ppm/° C.
TCE2 represents the temperature coefficient of Young's modulus of SiO2: 185 ppm/° C.
α1 represents the thermal expansion coefficient of Si: 3 ppm/° C.
α2 represents the thermal expansion coefficient of SiO2: 0.583 ppm/° C.
It is noted that the variation direction of the Young's modulus of the mass 112 (in this embodiment is the Si) is negative since temperature coefficient of Young's modulus of the mass 112 is negative (TCE1 of Si is −84.66 ppm/t), and that the variation direction of the Young's modulus of the first material 120 (in this embodiment is the SiO2) is positive since temperature coefficient of Young's modulus of the first material 120 is positive (TCE2 of SiO2 is 185 ppm/° C.). In this embodiment, the variation direction of the Young's modulus of the first material 120 is positive and the variation direction of the Young's modulus of the mass 112 is negative, which satisfies the condition "the variation direction of the Young's modulus of the first material 120 is opposite to the variation direction of the Young's modulus of the mass 112". Hence, the temperature coefficient of the frequency (TCf) of the vibrating unit 110 can be adjusted.

The following results are obtained when the material properties of Si and SiO2 above are substituted into Equation (12):

$$C_T = -\frac{E_2}{E_1}\left(\frac{TCE_2 + \alpha_2}{TCE_1 + \alpha_1}\right) = -\frac{66 \times 10^3}{169 \times 10^3}\left(\frac{185 + 0.583}{-84.66 + 3}\right) = 0.88753614$$

If the calculation of $C_T$ is rounded off to the fourth decimal place, the obtained value of $C_T$ is 0.8875.

Referring to FIG. 11A, in the embodiment, the section width w1 of the mass 112 may be 1.8852 um. The section width w2 of the first material 120 may be 0.350 um. The following is obtained when w1: 1.8852 um and w2: 0.350 um are substituted into Equation (11):

$$\frac{w_1^3}{6w_1^2 \cdot w_2 + 2w_2^3} = \frac{1.8852^3}{6 \times 3.8852^2 \times 0.350 + 2 \times 0.350^3} = 0.887517184$$

If the value is rounded off to the fourth decimal place, it is known that:

$$\frac{w_1^3}{6w_1^2 \cdot w_2 + 2w_2^3} = 0.8875 = C_T$$

Specifically, both of the section width w1 of the mass 112 and the section width w2 of the first material 120 have to satisfy the Equation (11), so as to adjust the temperature coefficient of the frequency of the vibrating unit 110 to be zero TCf.

However, if the section width w1 of the mass 112 and the section width w2 of the first material 120 do not both satisfy the Equation (11), it is insufficient to adjust the temperature coefficient of the overall frequency (TCf) of the vibrating unit 110 to zero TCf. For example, the section width w1 of the mass 112 may be 3.733 um, and the section width w2 of the first material 120 may be 0.350 um. When the foregoing is substituted into Equation (11), the following is obtained:

$$\frac{w_1^3}{6w_1^2 \cdot w_2 + 2w_2^3} = \frac{3.733^3}{6 \times 3.733^2 \times 0.350 + 2 \times 0.350^3} = 1.7724 \neq C_T$$

According to the above, the section width w1 (3.733 um) of the mass 112 and the section width w2 (0.350 um) of the first material 120 cannot both satisfy the Equation (11). To be more specific, even though the variation direction of the Young's modulus of the mass 112 is opposite to the variation direction of the Young's modulus of the first material 120, it is still insufficient to adjust the temperature coefficient of the overall frequency (TCf) of the vibrating unit 110 to zero TCf.

Further to the above, the second material 130 is a conductive material disposed on the first material 120 and extending to the third surface S3 of the stiffness element (the mass 112), in which the second material 130 is electrically connected to the stiffness element (the mass 112), where the second material 130 may be polycrystalline silicon, but the disclosure is not limited thereto. The second material 130 is disposed on the mass 112 of the composite MEMS device 100 used as the MEMS resonator, so as to form a conductive layer covering an outer surface of the first material 120 and the third surface S3 (bottom surface) of the mass 112, in which the second material 130 is electrically connected to the third surface S3 which is electrically connected to the outside. Accordingly, electric charge on the surface of the first material 120 is transmitted outside via the second material 130 to prevent electric charge accumulation, which generates an additional force to affect the movement of the vibrating unit 110. Thus, the resonance frequency of the vibrating unit 110 becomes more accurate.

Figure 12:
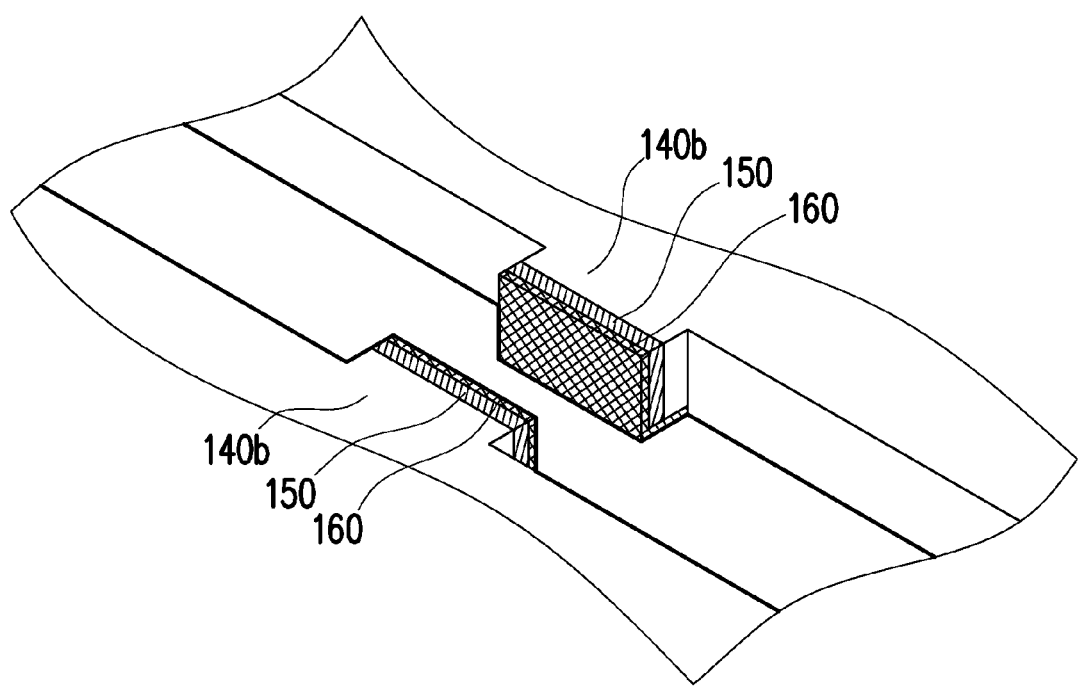
FIG. 12 is a partial enlarged view of an electrode of FIG. 9.
Figure 13:
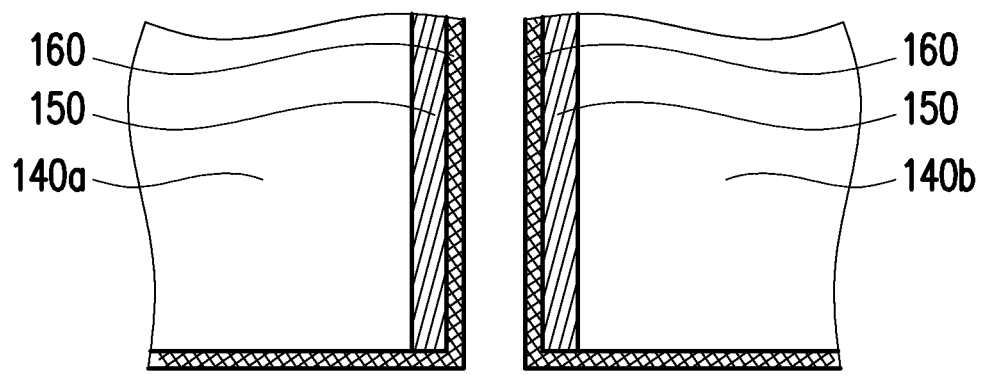
FIG. 13 is a partial lateral view of the electrode of FIG. 12.

FIG. 12 is a partial enlarged view of the electrode of FIG. 9. FIG. 13 is a partial lateral view of the electrode of FIG. 12. Referring to FIGS. 9, 12, and 13, in the embodiment, the third material 150 is disposed on outer surfaces of the driving electrode 140a and the sensing electrode 140b along the vibrating direction of the first axis A1, and the fourth material 160 is disposed on the third material 150 and extends to the bottom surfaces of the driving electrode 140a and the sensing electrode 140b to be electrically connected to the outside, in which the electric charge on the surface of the third material 150 are transmitted outside via the fourth material 160, wherein the third material 150 includes SiO2, and the fourth material 160 includes polycrystalline silicon, but the disclosure is not limited thereto. Therefore, the mass 112 of the vibrating unit 110 and the driving electrode 140a and the sensing electrode 140b in the embodiment all contain a composite material for preventing the resonance frequency of the vibrating unit 110 from becoming unstable due to change of temperature. Accordingly, the composite MEMS device 100 maintains high stability and accuracy in environments of different temperatures.

Figure 14:
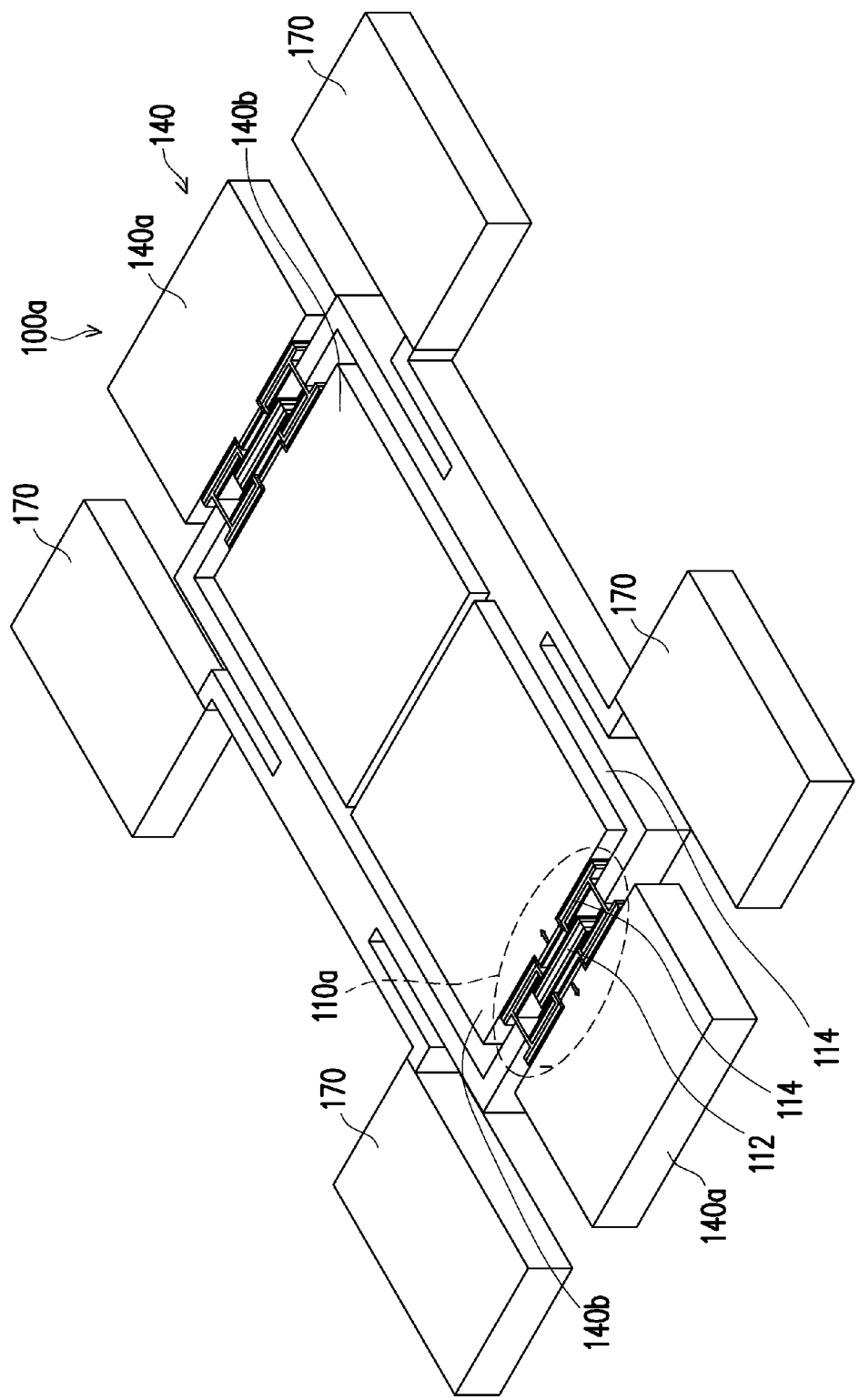
FIG. 14 is a simplified schematic view of a composite micro-electro-mechanical-system (MEMS) device according to second one of exemplary embodiments of the disclosure.
Figure 15A:
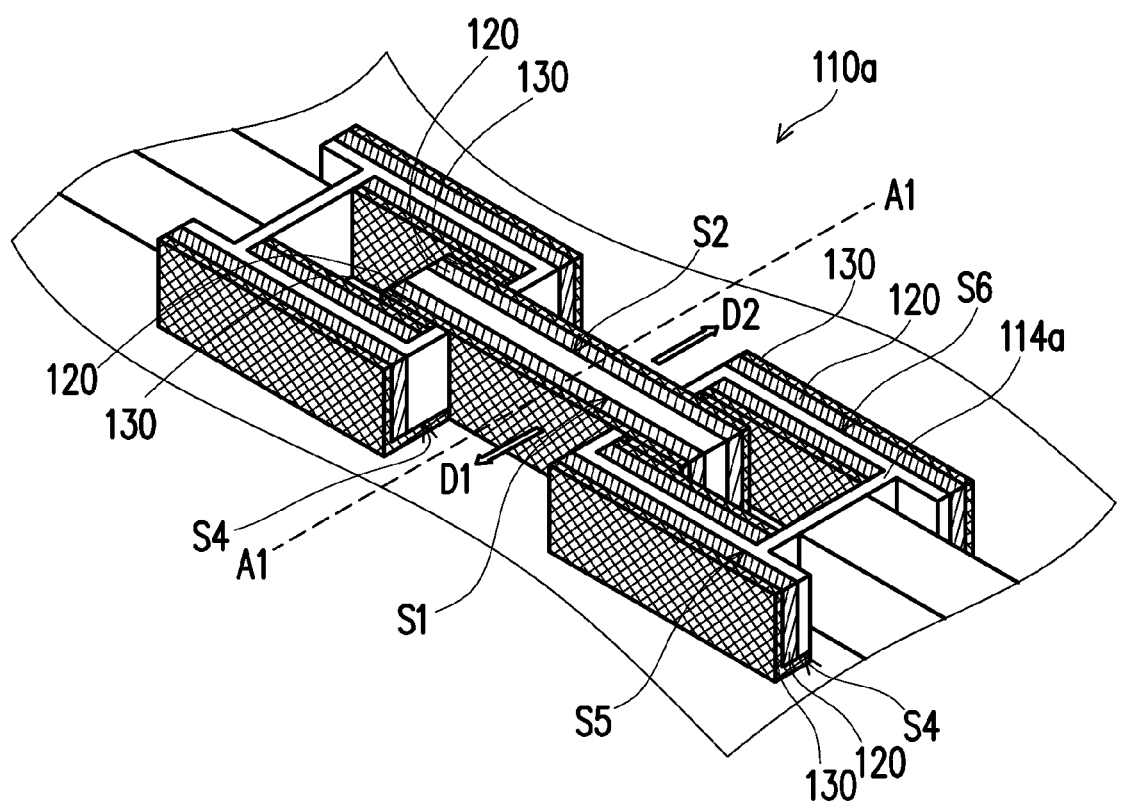
FIG. 15A is a simplified schematic view of a vibrating unit of FIG. 14.
Figure 15B:
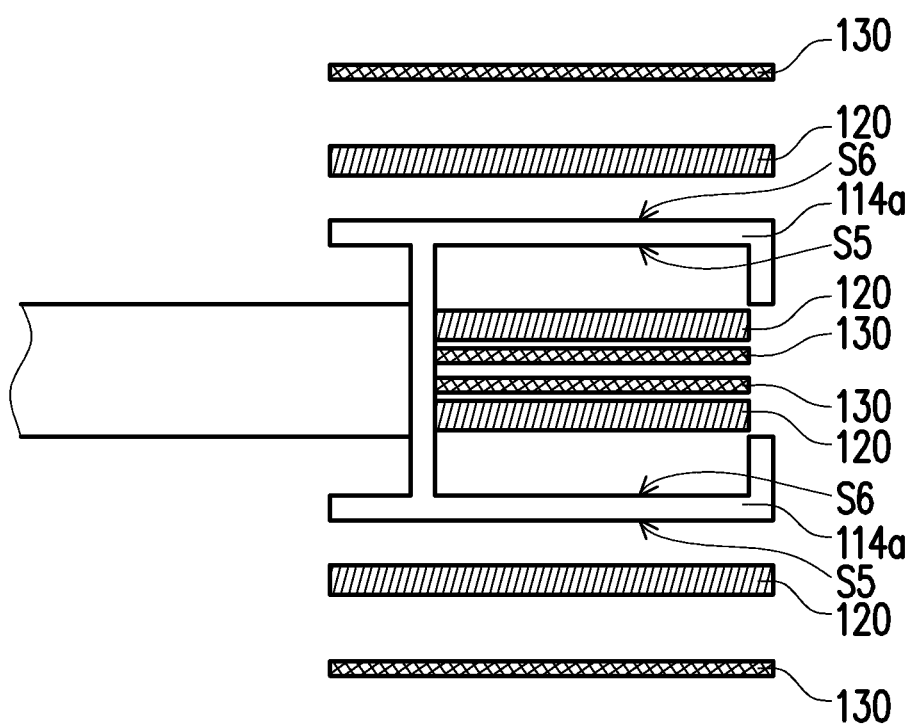
FIG. 15B is a top exploded view of a flexure of FIG. 15A.

FIG. 14 is a simplified schematic view of a composite micro-electro-mechanical-system (MEMS) device according to second one of exemplary embodiments of the disclosure. FIG. 15A is a simplified schematic view of a vibrating unit of FIG. 14. FIG. 15B is a top exploded view of a flexure of FIG. 15A. Referring to FIGS. 14 to 15B, in the embodiment, a composite micro-electro-mechanical-system (MEMS) device 100a includes a vibrating unit 110a, a first material 120, a second material 130, an electrode 140, and an anchor 170. The composite MEMS device 100a may be an MEMS resonator, but the disclosure is not limited thereto.

The composite MEMS device 100a of the embodiment is similar to the composite MEMS device 100 of the first embodiment. Therefore, components denoted by the same reference numbers in the description and figures (FIGS. 14 to 15B) of the embodiment and in the description and figures (FIGS. 8 to 13) of the first embodiment have similar or identical materials, functions, and operations. For details of some components of the composite MEMS device 100a in the embodiment, please refer to the descriptions of the first embodiment, which will not be repeated hereinafter.

A main difference between the composite MEMS device 100a of the embodiment and the composite MEMS device 100 lies in that: the mass 112 and the flexure 114a of the vibrating unit 110 of the composite MEMS device 100a are all composite materials. More specifically, the flexure 114a has two outer surfaces S5 and S6 respectively parallel to the first surface S1 and the second surface S2 of the mass 112, wherein the two outer surfaces S5 and S6 of the flexure 114a also respectively face toward the first direction D1 and the second direction D2 of the first axis.

Therefore, in the embodiment, the first material 120 is further disposed on the two outer surfaces S5 and S6 of the flexure 114a. When the temperature changes, the variation direction of the Young's modulus of the first material 120 is opposite to the variation direction of the Young's modulus of the mass 112 serving as the stiffness element, so as to adjust the overall temperature coefficient of the frequency of the vibrating unit 110. The second material 130 is disposed on the first material 120 and extends to a bottom surface S4 of the flexure 114a, in which the second material is electrically connected to the flexure 114a and further electrically connected to the outside via the anchor 170. Accordingly, the electric charge on the surface of the first material 120 are transmitted outside via the second material 130 to prevent charge accumulation, which generates an additional force affecting the movement of the vibrating unit 110, and to make the resonance frequency of the vibrating unit 110 more stable. Thus, the mass 112 and the flexure 114a of the vibrating unit 110 in the embodiment are all composite materials for further stabilizing the resonance frequency of the vibrating unit 110.

Figure 16:
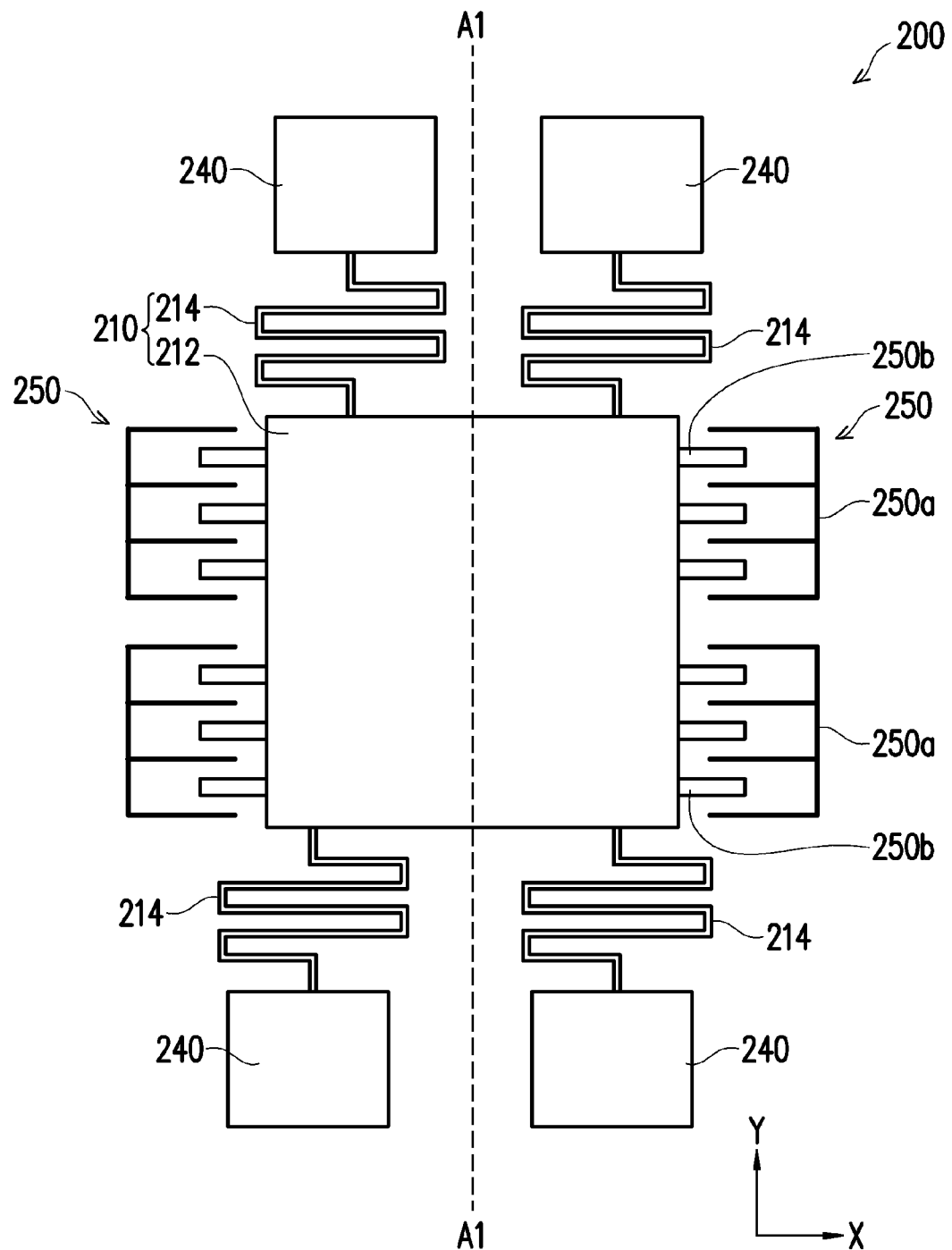
FIG. 16 is a simplified schematic view of a composite micro-electro-mechanical-system (MEMS) device according to third one of exemplary embodiments of the disclosure.
Figure 17:
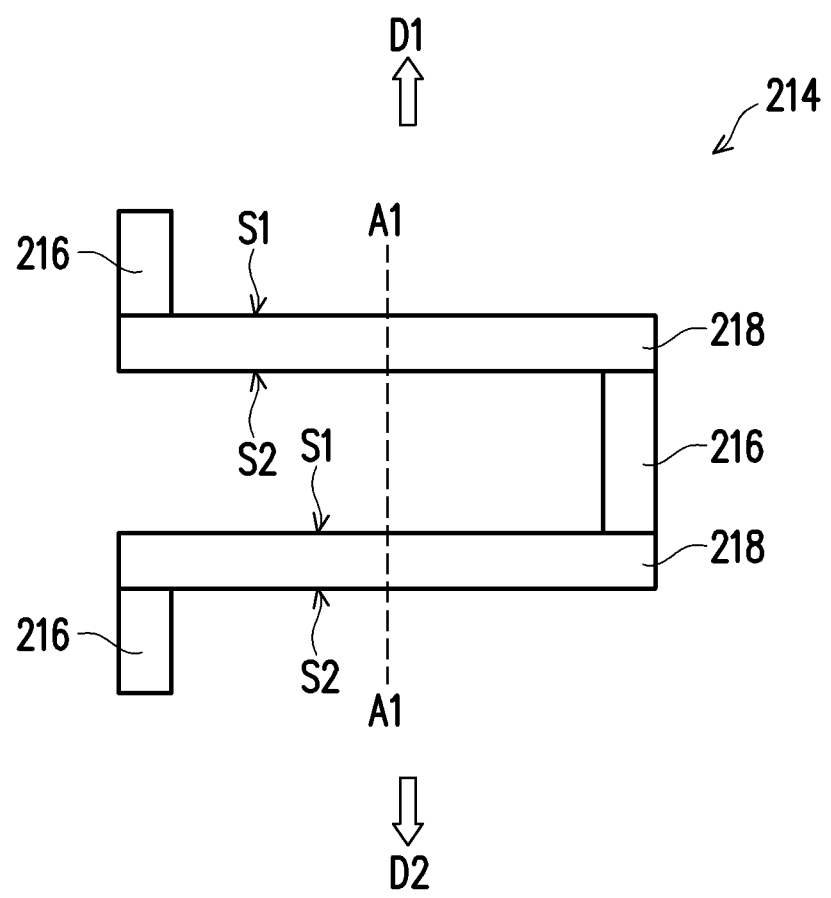
FIG. 17 is a simplified schematic view of a flexure of FIG. 16 without material layers.

FIG. 16 is a simplified schematic view of a composite micro-electro-mechanical-system (MEMS) device according to third one of exemplary embodiments of the disclosure. FIG. 17 is a simplified schematic view of a flexure of FIG. 16 without first material and second material. Referring to FIGS. 16 and 17, in the embodiment, a composite micro-electro-mechanical-system (MEMS) device 200 includes a vibrating unit 210, a first material 220, and a second material 230. The composite MEMS device 200 may be an MEMS accelerometer, but the disclosure is not limited thereto.

In the embodiment, the vibrating unit 210 includes a mass 212 and a flexure 214. The flexure 214 connects the mass 212 and an anchor 240. In the embodiment, the stiffness of the flexure 214 significantly affects the resonance frequency of the vibrating unit 210. Therefore, the stiffness element in the embodiment is the flexure 214. When the mass 212 is configured to oscillate along the first axis A1, which is a Y axis direction in FIG. 16 for example, the flexure 214 also oscillates along the first axis A1. In addition, an electrode 250 is disposed on two sides of the mass 212, wherein the electrode 250 includes a stationary electrode 250a and a movable electrode 250b. When the flexure 214 oscillates along the first axis A1 and causes the mass 212 to oscillate together along the first axis A1, the stationary electrode 250a and the movable electrode 250b generate a capacitance change.

Thus, when the composite MEMS device 200 serving as the MEMS accelerometer accelerates in the first axis A1 (Y axis), the mass 212 that is connected to the anchor 240 by the flexure 214 serving as the stiffness element is translated in the first axis A1, and a relative distance between the stationary electrode 250a and the movable electrode 250b is changed due to the displacement of the mass 212. To be more specific, the change of the relative distance between the stationary electrode 250a and the movable electrode 250b results in change of capacitance between the stationary electrode 250a and the movable electrode 250b. Accordingly, the composite MEMS device 200 senses the capacitance change to calculate the acceleration.

Figure 18:
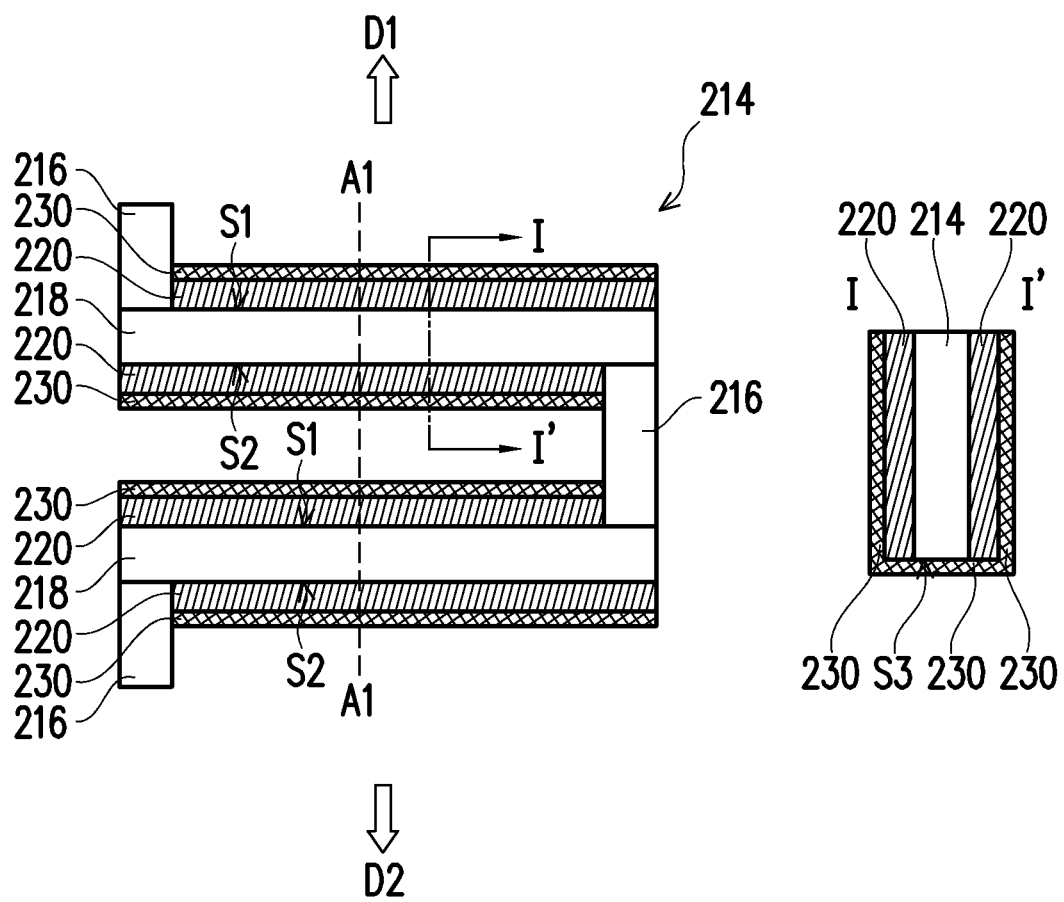
FIG. 18 is a simplified schematic view of the flexure of FIG. 16.

FIG. 18 is a simplified schematic view of the flexure of FIG. 16. With reference to FIGS. 16 and 18, in the embodiment, a material of the flexure 214 may be Si, and the flexure 214 includes a span 218 and a connector 216 connecting with the span 218. The span 218 includes a first surface Si, a second surface S2, and a third surface S3. The first surface S1 faces toward a first direction D1 of the first axis A1 and the second surface S2 faces toward a second direction D2 of the first axis A1, wherein the first direction D1 is opposite to the second direction D2, and the third surface S3 is connected with the first surface S1 and the second surface S2. In other words, the first surface S1 and the second surface S2 face toward two opposite directions of the first axis A1. The first material 220 is disposed on the first surface Si and the second surface S2 of the span 218 of the flexure 214. Furthermore, the first material 220 covers the entirety of the first surface S1 and the second surface S2, wherein the first material 220 includes SiO2, but the disclosure is not limited thereto. When the temperature changes, the variation direction of the Young's modulus of the first material 220 is opposite to the variation direction of the Young's modulus of the flexure 214 which serves as the stiffness element.

More specifically, in the composite MEMS device 200 serving as the MEMS accelerometer in the embodiment, the first material 220 is disposed on the first surface S1 and the second surface S2, facing toward the vibrating direction (the first axis A1), of the span 218 of the flexure 214 that serves as the stiffness element. Therefore, when the temperature changes, the variation direction of the Young's modulus of the first material 220 is opposite to the variation direction of the Young's modulus of the flexure 214, so as to adjust the overall temperature coefficient of the frequency of the vibrating unit 210.

Moreover, the second material 230 is a conductive material (e.g. polycrystalline silicon), which is disposed on the first material 220 to form a conductive layer covering an outer surface of the first material 220. And, the second material 230 extends to the third surface S3 of the span 218, in which the second material 230 is electrically connected to the third surface S3 of the span 218 that can be electrically connected to the outside. Accordingly, electric charge on the surface of the first material 220 are transmitted outside via the second material 230 to prevent electric charge accumulation, which may generate an additional force to affect the movement of the vibrating unit 210. The flexure 214 of the vibrating unit 210 in the embodiment is a composite material for further improving accuracy of the composite MEMS device 200.

Figure 19:
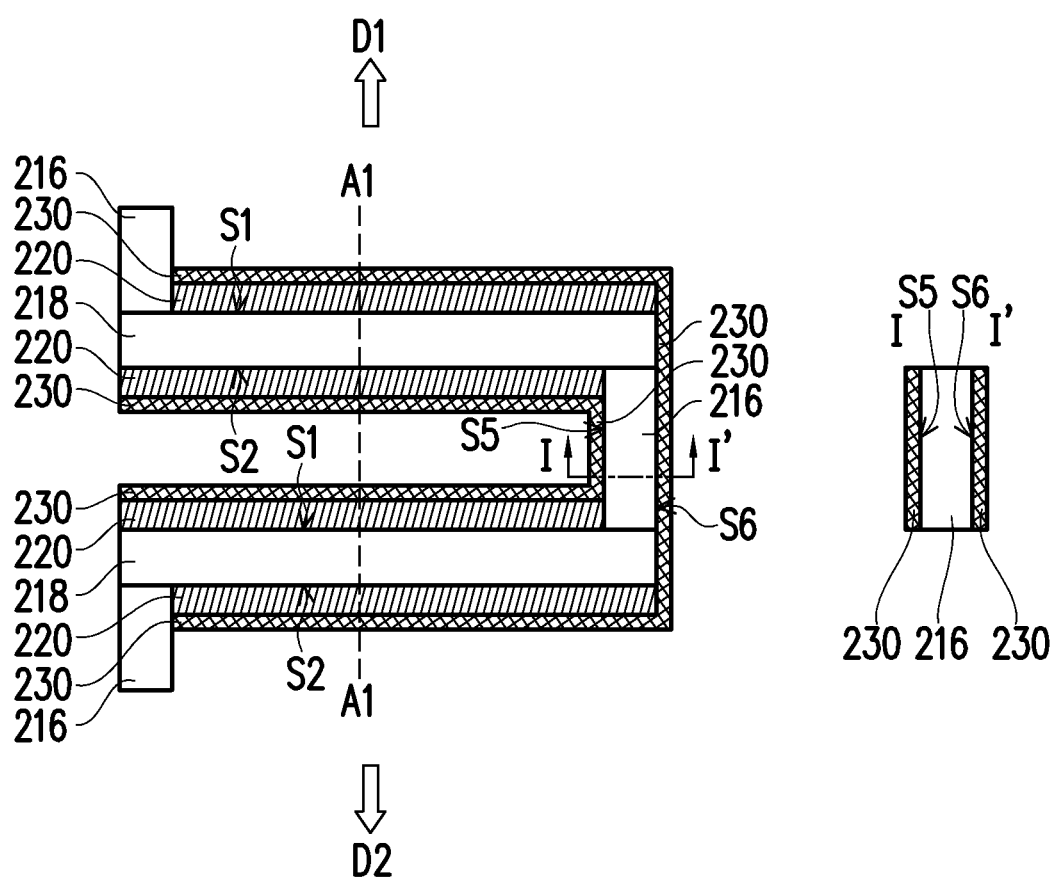
FIG. 19 is a simplified schematic view of a flexure according to another embodiment of the disclosure.

FIG. 19 is a simplified schematic view of a flexure according to another embodiment of the disclosure. With reference to FIG. 19, in the embodiment, the second material 230 is disposed on the first material 220 and the outer surfaces S5 and S6 of the connector 216. In other words, a difference between the embodiment and the aforementioned third embodiment is that the second material 230 further covers the connector 216. Hence, the second material 230 is disposed on the span 218 of the flexure 214 to form a conductive layer covering the first material 220, and the second material 230 is also disposed on the connector 216, in which the second material 230 disposed on the first material 220 is electrically connected to the connector 216 which is electrically connected to the outside, thereby increasing the efficiency of removing the electric charge from the surface of the first material 220.

Figure 20:
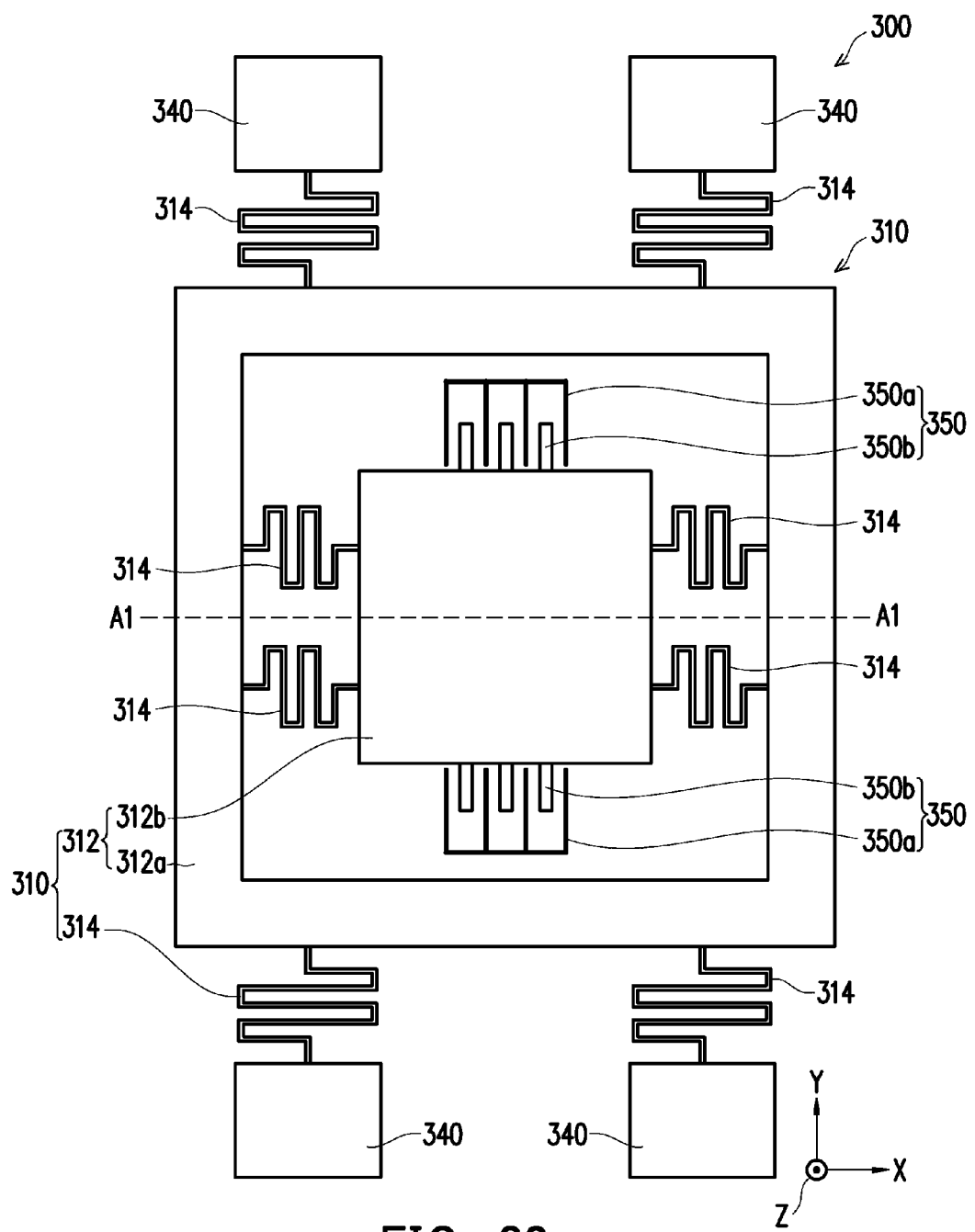
FIG. 20 is a simplified schematic view of a composite micro-electro-mechanical-system (MEMS) device according to fourth one of exemplary embodiments of the disclosure.
Figure 21:
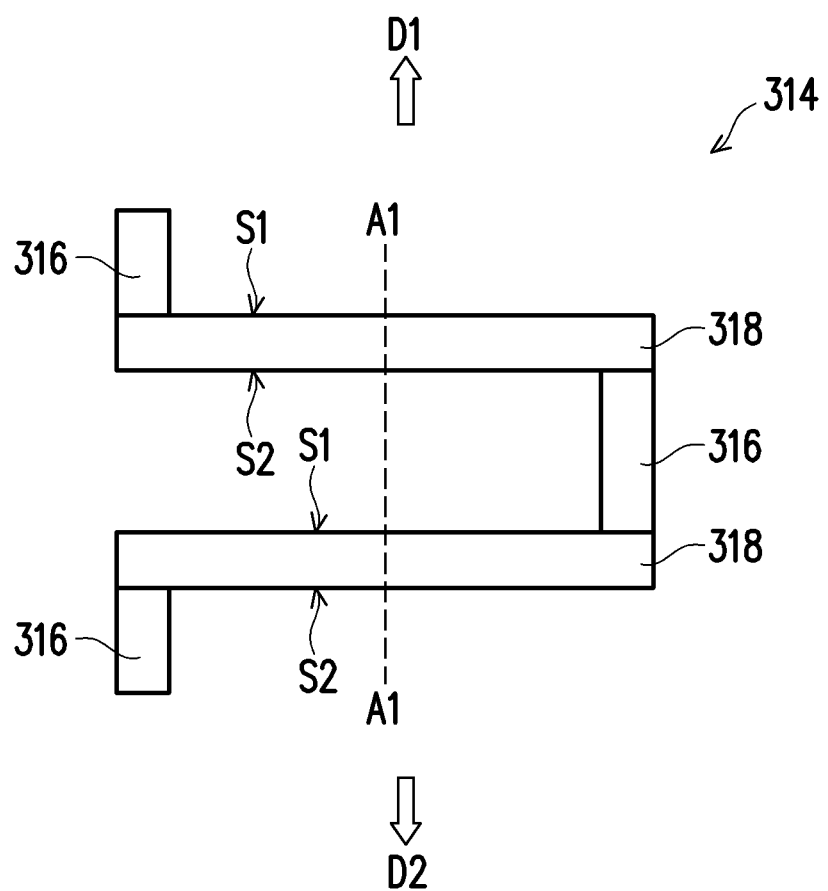
FIG. 21 is a simplified schematic view of a flexure of FIG. 20 without material layers.

FIG. 20 is a simplified schematic view of a composite micro-electro-mechanical-system (MEMS) device according to fourth one of exemplary embodiments of the disclosure. FIG. 21 is a simplified schematic view of a flexure of FIG. 20 without first material and second material. Referring to FIGS. 20 and 21, in the embodiment, a composite micro-electro-mechanical-system (MEMS) device 300 includes a vibrating unit 310, a first material 320, and a second material 330. The composite MEMS device 300 may be an MEMS gyroscope, but the disclosure is not limited thereto.

In the embodiment, the vibrating unit 310 includes a first mass 312a, a second mass 312b, and a flexure 314. In the embodiment, the first mass 312a is a frame. The flexure 314 is connected with the first mass 312a and an anchor 340. The frame 312a and the second mass 312b are also connected with each other by the flexure 314. The frame 312a oscillates along the Y axis direction of FIG. 20 to drive the second mass 312b to oscillate along the Y axis direction. Hence, when the composite MEMS device 300 serving as the MEMS gyroscope to senses an angular velocity in a Z axis direction, the second mass 312b oscillates along the first axis A1 and is translated in the X axis.

When the angular velocity exists in the Z axis direction, the oscillation of the frame 312a in the Y axis direction of FIG. 20 needs to reach the state of resonance, in which the second mass 312 has the greatest displacement in the X axis. Therefore, the resonance frequency of the frame 312a affects the sensitivity for measuring the angular velocity.

In the embodiment, the stiffness of the flexure 314 significantly affects the resonance frequency of the frame 312a. Therefore, in the embodiment, the flexure 314 is the stiffness element in the vibrating unit 310. In addition, an electrode 350 is disposed on two sides of the second mass 312b, wherein the electrode 350 includes a stationary electrode 350a and a movable electrode 350b. When the second mass 312b oscillates along the first axis A1, the stationary electrode 350a and the movable electrode 350b generate a capacitance change. To be more specific, the change of a relative distance between the stationary electrode 350a and the movable electrode 350b causes the capacitance between the stationary electrode 350a and the movable electrode 350b to change. Accordingly, the composite MEMS device 300 serving as the MEMS gyroscope senses the capacitance change to calculate the angular velocity.

Figure 22:
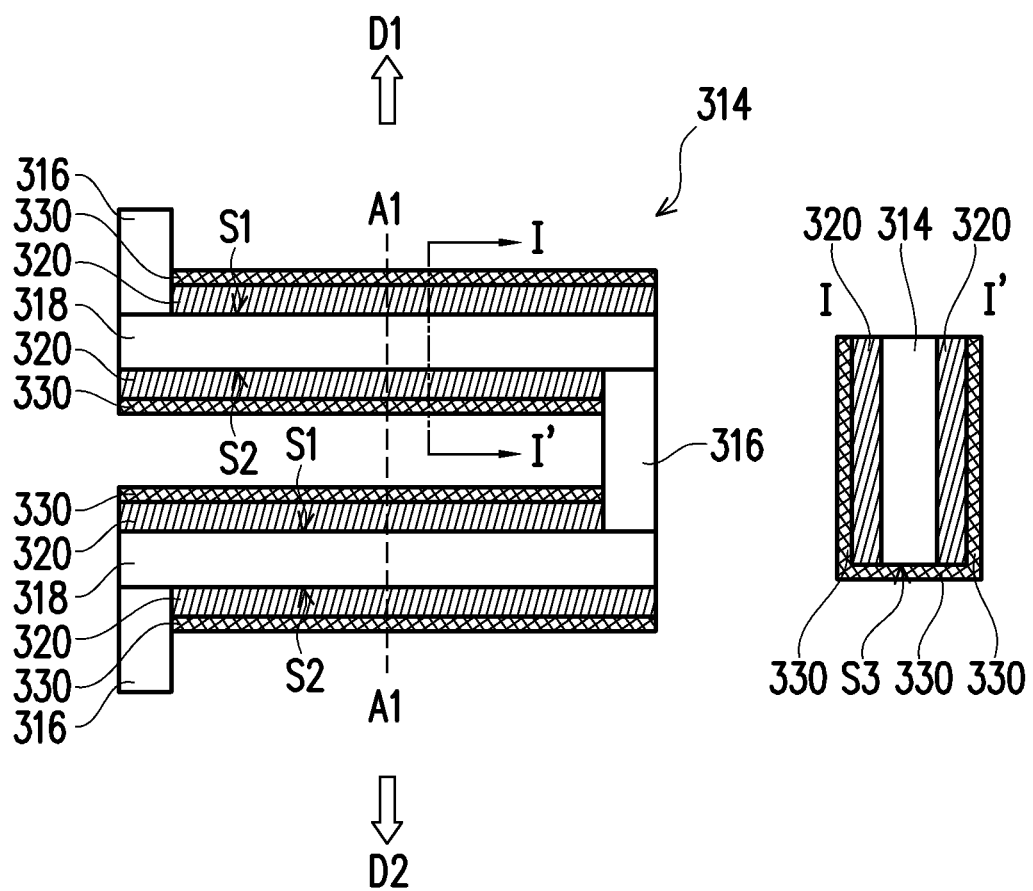
FIG. 22 is a simplified schematic view of the flexure of FIG. 20.

FIG. 22 is a simplified schematic view of the flexure of FIG. 20. With reference to FIGS. 20 and 22, in the embodiment, the flexure 314 includes the span 318 and the connector 316, wherein two ends of the connector 316 are connected with the span 318. The span 318 includes the first surface S1, the second surface S2, and the third surface S3. The first surface S1 faces toward the first direction D1 of the first axis A1 and the second surface S2 faces toward the second direction D2 of the first axis A1, wherein the first direction D1 is opposite to the second direction D2, and the third surface S3 is connected with the first surface S1 and the second surface S2. In other words, the first surface S1 and the second surface S2 face toward two opposite directions of the first axis A1 respectively. The first material 320 is disposed on the first surface S1 and the second surface S2 of the span 318 of the flexure 314 (stiffness element). Furthermore, the first material 320 covers the entirety of the first surface S1 and the entirety of the second surface S2, wherein the first material 320 includes SiO2, but the disclosure is not limited thereto. When the temperature changes, the variation direction of the Young's modulus of the first material 320 is opposite to the variation direction of the Young's modulus of the flexure 314 which serves as the stiffness element.

More specifically, in the composite MEMS device 300 serving as the MEMS gyroscope in the embodiment, the first material 320 is disposed on the first surface S1 and the second surface S2, facing toward the vibrating direction (the first axis A1), of the span 318 of the flexure 314 serving as the stiffness element. Therefore, when the temperature changes, the variation direction of the Young's modulus of the first material 320 is opposite to the variation direction of the Young's modulus of the flexure 314 serving as the stiffness element, so as to adjust the temperature coefficient of the frequency of the vibrating unit 310.

In addition, the second material 330 is a conductive material disposed on the first material 320. The second material 330 may be polycrystalline silicon, but the disclosure is not limited thereto. In other words, the second material 330 is disposed on the span 318 of the flexure 314 of the composite MEMS device 300 serving as the MEMS accelerometer to form a conductive layer covering an outer surface of the first material 320, in which the second material 330 is electrically connected to the connector 316 t which is electrically connected to the outside. Accordingly, electric charge on the surface of the first material 320 is transmitted outside via the second material 330 to prevent charge accumulation, which may generate an additional force to affect the movement of the vibrating unit 310. Thus, the resonance frequency of the vibrating unit 310 becomes more accurate.

Figure 23:
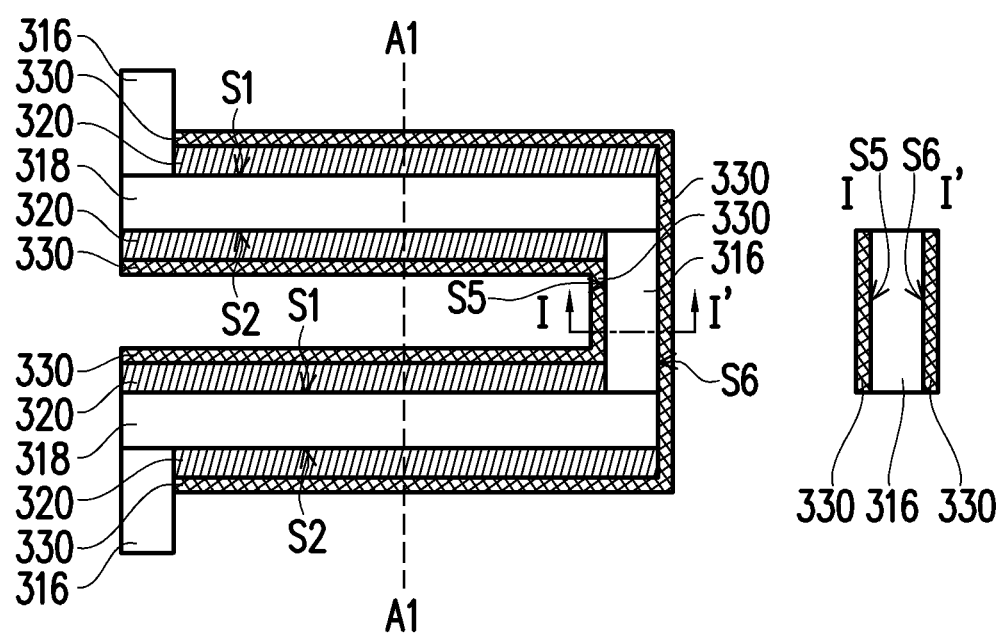
FIG. 23 is a simplified schematic view of a flexure according to another embodiment of the disclosure.

FIG. 23 is a simplified schematic view of a flexure according to another embodiment of the disclosure. With reference to FIG. 23, in the embodiment, the second material 330 is disposed on the first material 320 and the outer surfaces S5 and S6 of the connector 316. In other words, a difference between the embodiment and the aforementioned fourth embodiment is that the second material 330 further covers the connector 316. The second material 330 is disposed on the span 318 of the flexure 314 to form a conductive layer covering the outer surface of the first material 320, and the second material 330 is also disposed on the connector 316, in which the second material 330 disposed on the first material 320 is electrically connected to the connector 316 that is electrically connected to the outside. Accordingly, the electric charge on the surface of the first material 320 is removed to the outside via the second material 330.

It is known from the above embodiments that, by disposing two types of materials on two surfaces, facing toward the vibrating direction, of the stiffness element (e.g. mass or flexure) of the MEMS device, the stiffness element becomes a composite structure. As a result, when the temperature changes, the variation direction of the Young's modulus of the first material is opposite to the variation direction of the Young's modulus of the stiffness element for preventing the resonance frequency of the vibrating unit from being affected by temperature and making the resonance frequency more stable. In addition, the second material, which covers the first material and extends to and electrically connects to the stiffness element, transmits the electric charge on the surface of the first material outside and maintains stability of the resonance frequency of the vibrating unit. Therefore, the composite MEMS devices 100, 100a, 200, and 300 have higher accuracy in comparison with the non-composite MEMS device.

Figure 24:
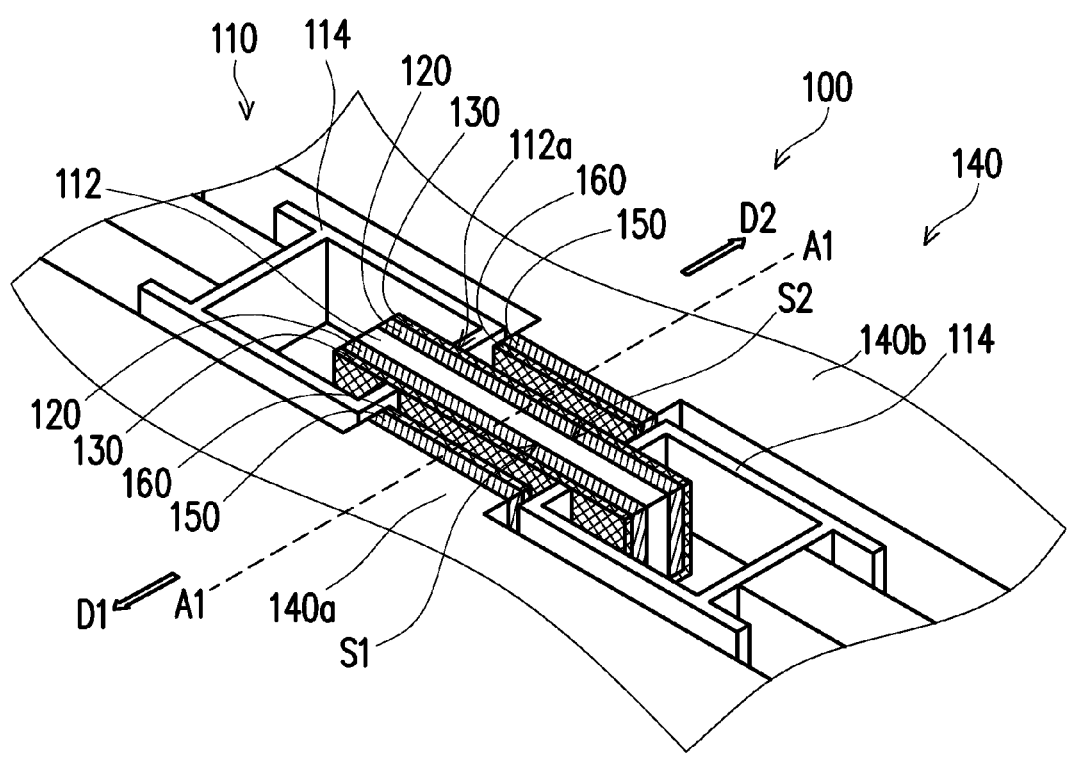
FIG. 24 is a partial enlarged view of a composite micro-electro-mechanical-system (MEMS) device according to an embodiment of the disclosure.
Figure 25:
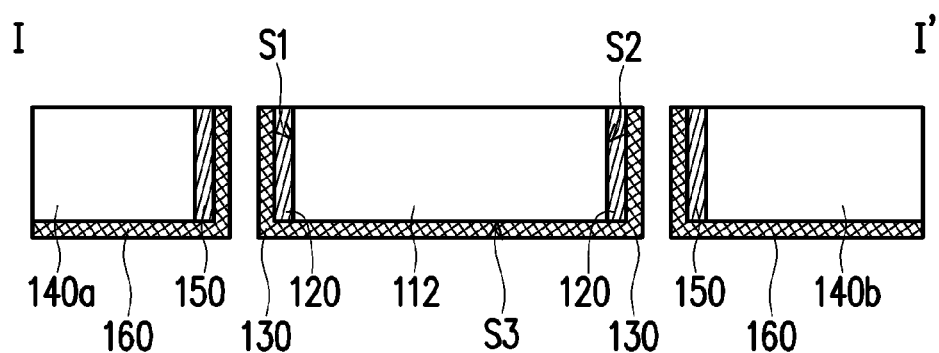
FIG. 25 is a cross-sectional view of the composite micro-electro-mechanical-system (MEMS) device of FIG. 24.

Further to the above, the disclosure provides a manufacturing method of a composite MEMS device. FIG. 24 is a partial enlarged view of a composite micro-electro-mechanical-system (MEMS) device according to an embodiment of the disclosure. FIG. 25 is a cross-sectional view of the composite micro-electro-mechanical-system (MEMS) device of FIG. 24. Referring to FIGS. 24 and 25, the composite MEMS device of the embodiment may be the composite MEMS device 100 disclosed in the first embodiment. However, it should be noted that the disclosure is not limited thereto. Hereinafter the composite MEMS device 100 of the first embodiment is illustrated as an example to explain the manufacturing method of the embodiment.

Figure 26A:
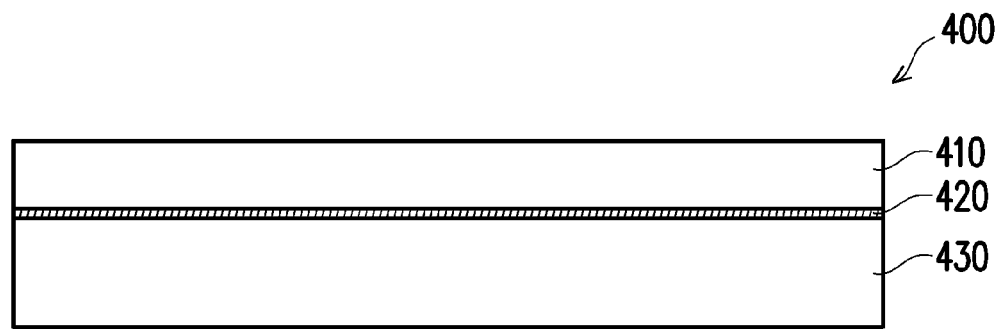
FIGS. 26A to 26T are cross-sectional views showing a process flow of manufacturing the composite micro-electro-mechanical-system (MEMS) device of FIG. 24.
Figure 26B:
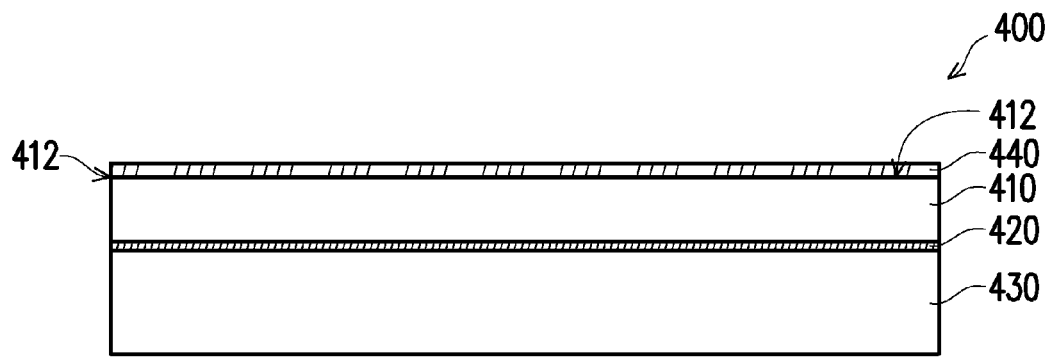
Figure 26C:
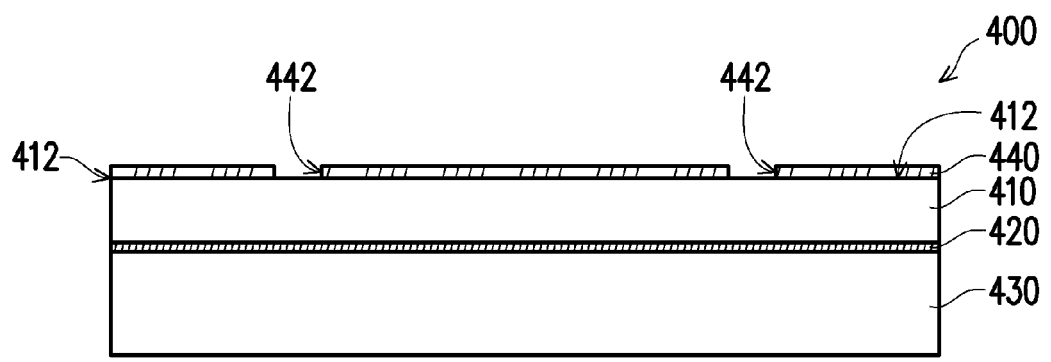
Figure 26D:
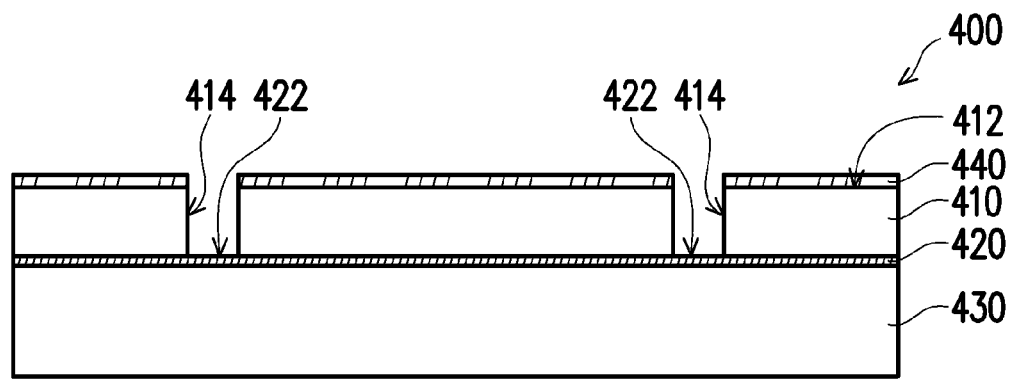
Figure 26E:
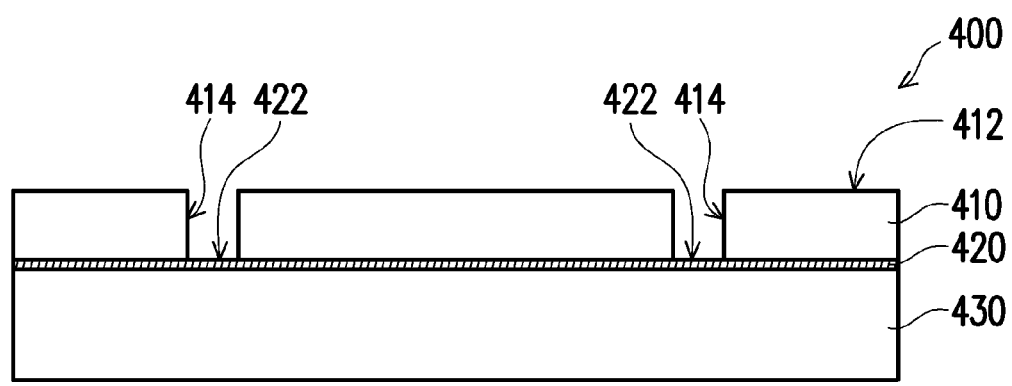
Figure 26F:
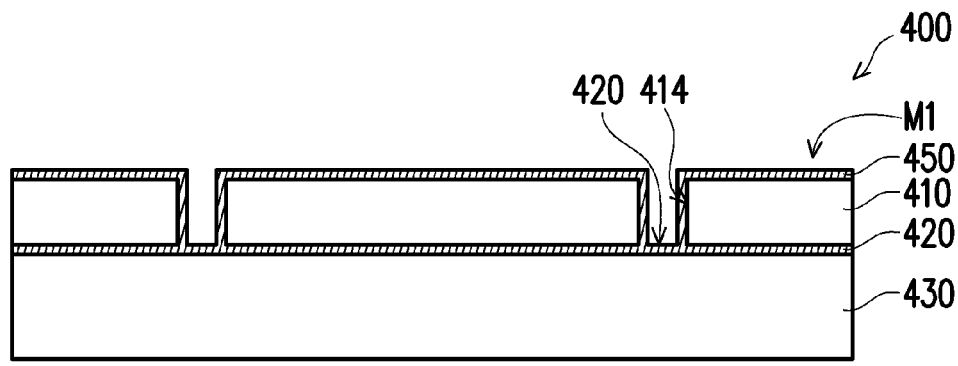
Figure 26G:
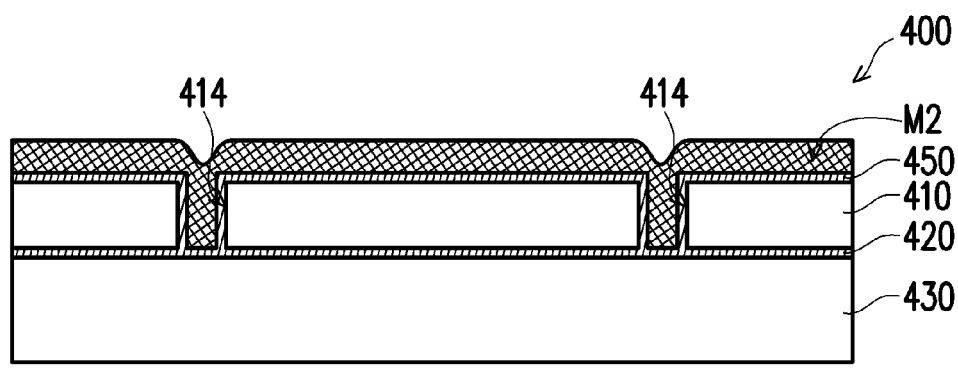
Figure 26H:
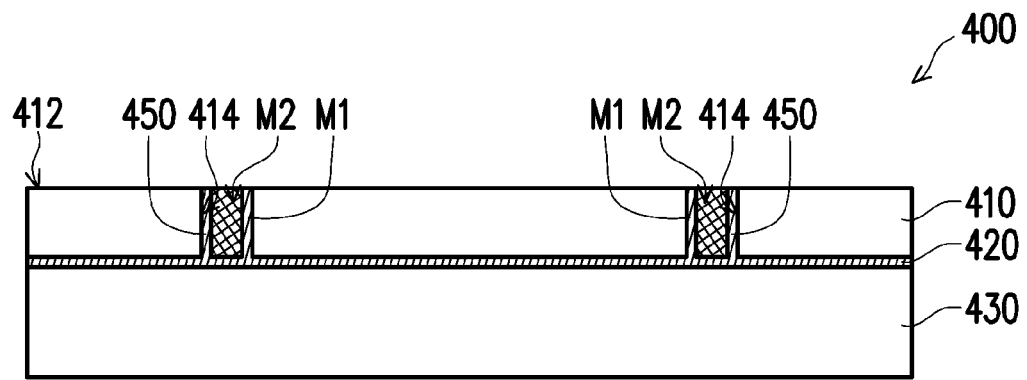
Figure 26I:
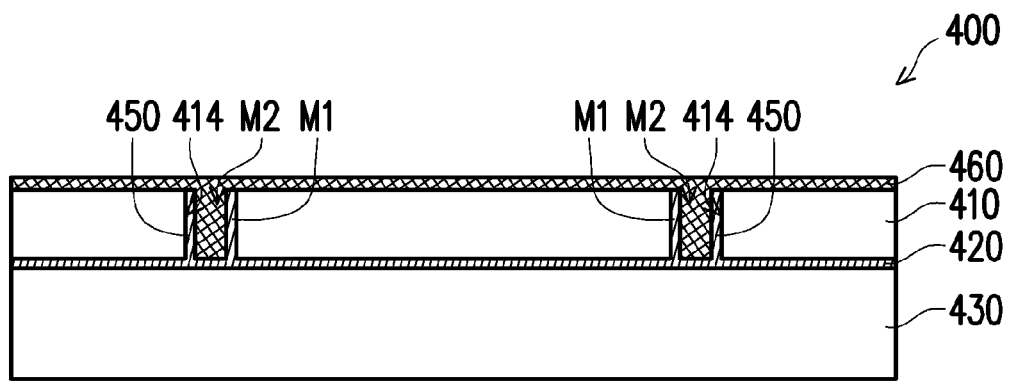
Figure 26J:
Figure 26K:
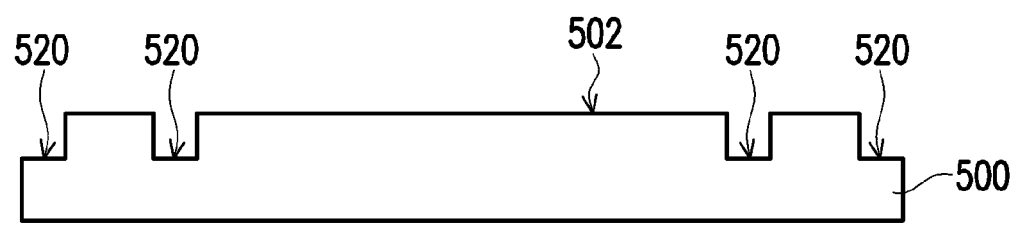
Figure 26L:
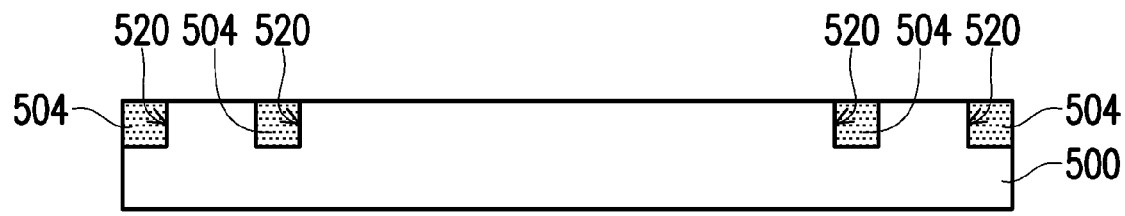
Figure 26M:
Figure 26N:
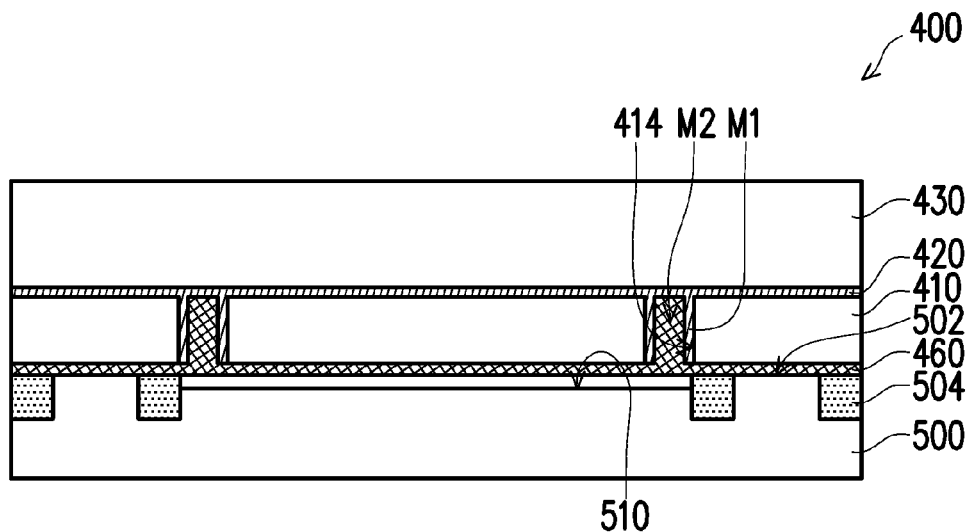
Figure 26O:
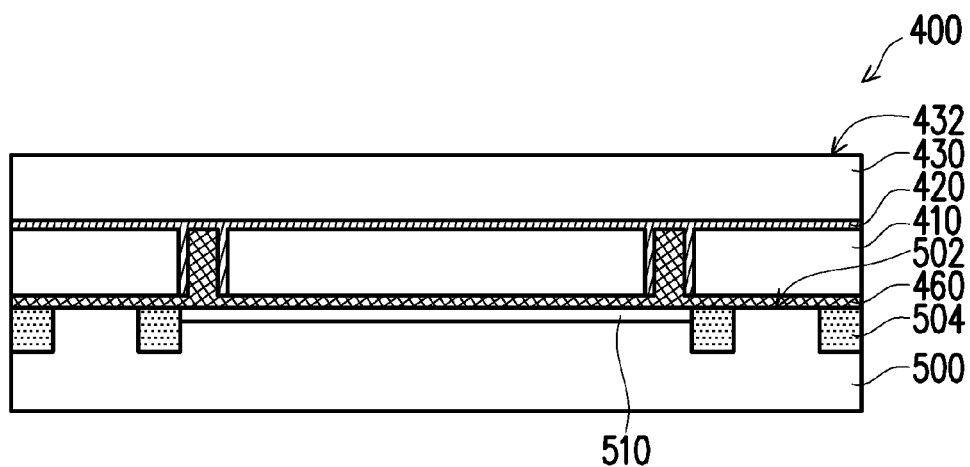
Figure 26P:
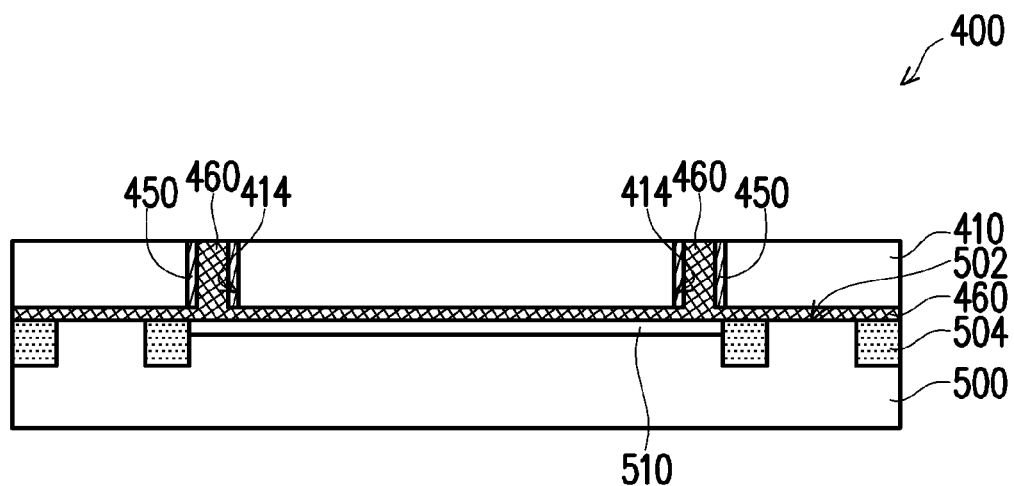
Figure 26Q:
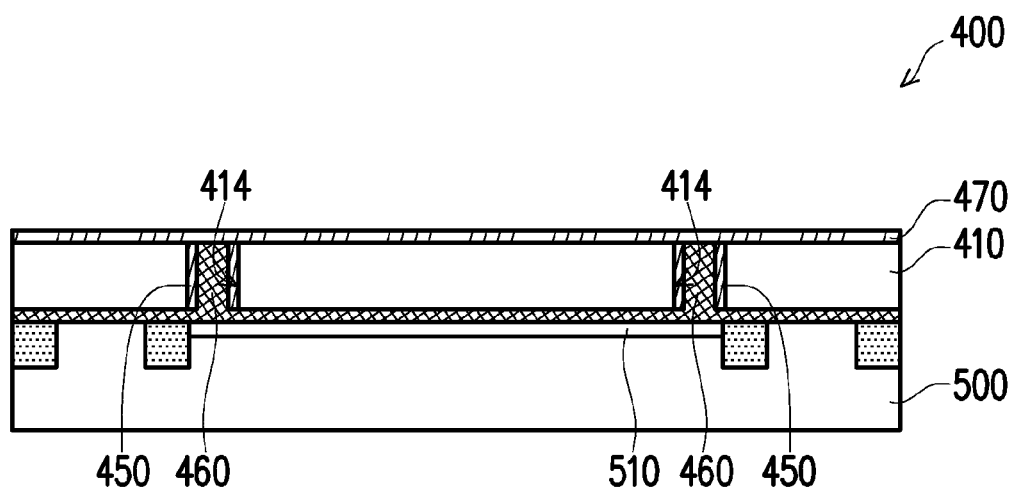
Figure 26R:
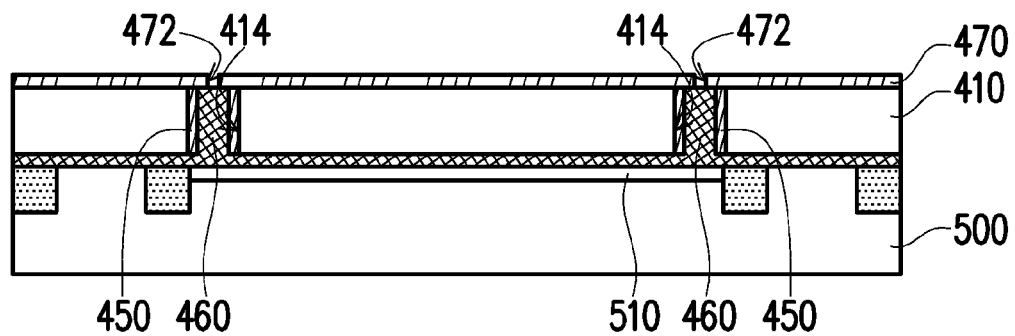
Figure 26S:
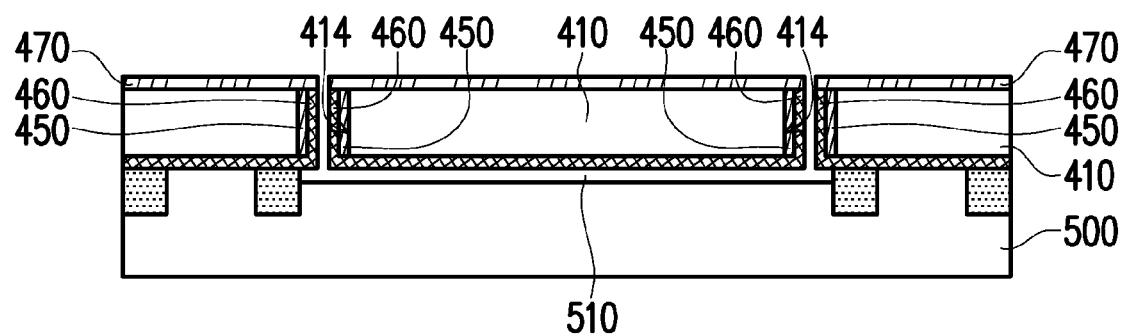
Figure 26T:
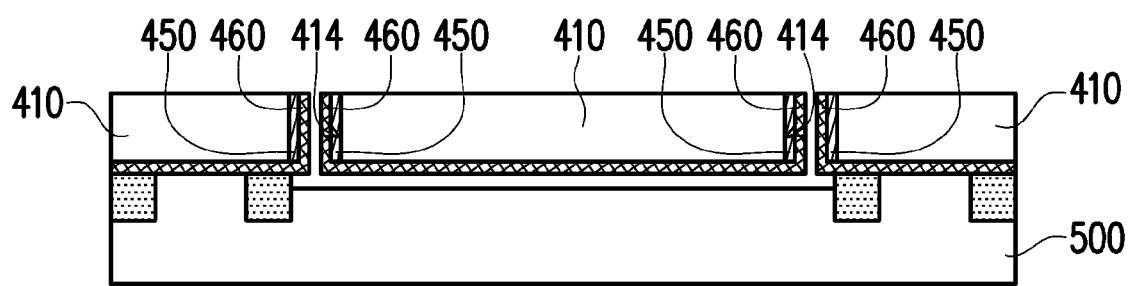
Figure 27:
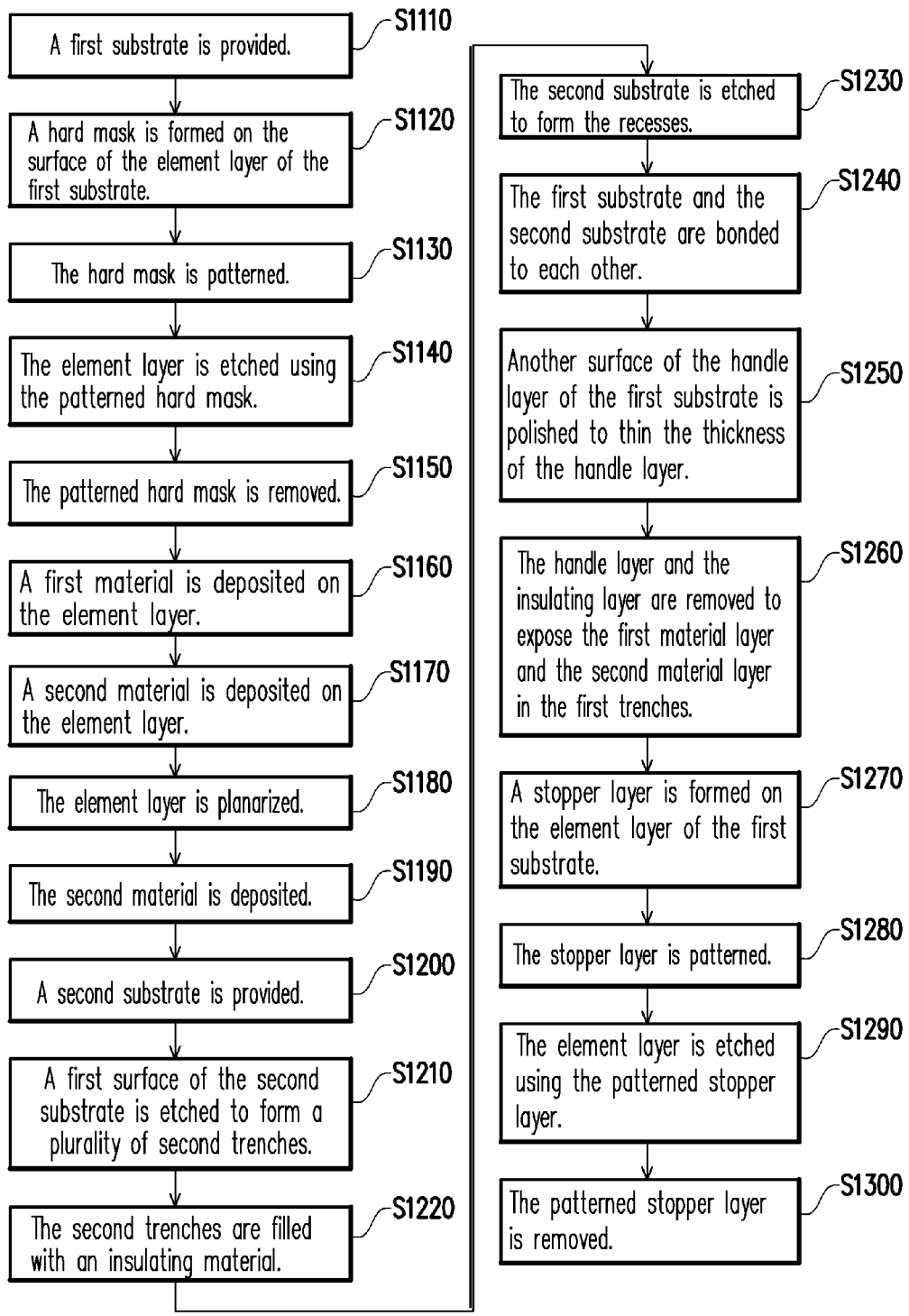
FIG. 27 is a flowchart of manufacturing the composite micro-electro-mechanical-system (MEMS) device of FIG. 24.

FIGS. 26A to 26T are cross-sectional views showing a process flow of manufacturing the composite MEMS device of FIG. 24. FIG. 27 is a flowchart for manufacturing the composite MEMS device of FIG. 24.

Hereinafter the manufacturing method of the composite MEMS device of the embodiment is explained following the steps of FIGS. 26A to 26T and 27 and the relevant descriptions.

First, in Step S1110, a first substrate 400 is provided. Referring to FIG. 26A and FIG. 27, in the embodiment, the first substrate 400 includes at least one device layer 410, an insulation layer 420, and a handle layer 430. The first substrate 400 may be a silicon on insulator wafer (SOI wafer), wherein a material of the device layer 410 and the handle layer 430 is Si, and a material of the insulation layer 420 disposed between the device layer 410 and the handle layer 430 is SiO2, but the disclosure is not limited thereto.

Next, a patterned hard mask is formed for carrying out a subsequent step to etch the device layer 410. In the embodiment, a process of forming the patterned hard mask includes the following steps: first, in Step S1120, a hard mask 440 is formed on a surface 412 of the device layer 410 of the first substrate 400. Referring to FIG. 26B and FIG. 27, in the embodiment, a material of the hard mask 440 may include silicon nitride, which is deposited on the surface 412 of the device layer 410 by a plasma enhanced chemical vapor deposition (PECVD) process. Then, in Step S1130, the hard mask 440 is patterned. Referring to FIG. 26C and FIG. 27, the hard mask 440 is exposed and developed on a photoresist by a lithography process, and an opening 442 is formed on the hard mask 440 by wet etching by using a phosphoric acid solution, so as to form a pattern.

Following that, in Step S1140, the device layer 410 is etched by using the patterned hard mask 440. With reference to FIG. 26D and FIG. 27, in the embodiment, after forming the patterned hard mask 440, the patterned hard mask 440 is used to etch the device layer 410, so as to form a plurality of first trenches 414 and expose a portion of a surface 422 of the insulation layer 420, wherein the first trenches 414 are formed on the device layer 410 by an inductively coupled plasma (ICP) etching process (dry etching process). Lastly, in Step S1150, the patterned hard mask 440 is removed. With reference to FIG. 26E and FIG. 27, after forming the first trenches 414 on the device layer 410, a wet etching process using an etching solution such as phosphoric acid solution is performed to remove the patterned hard mask 440 from the device layer 410.

Thereafter, in Step S1160, a first material M1 is deposited on the device layer 410. Referring to FIG. 26F and FIG. 27, after removing the patterned hard mask 440, the first material M1 is deposited on the device layer 410 to form a first material layer 450 that is conformal with the device layer 410, wherein the first material M1 is formed on an inner side of each first trench 414. In the embodiment, the first material M1 may be SiO2, which is deposited on the device layer 410 by a thermal oxidation layer process. Because the first material M1 is formed on the inner side of each of the first trenches 414, and the first trenches 414 expose a portion of the surface 422 of the insulation layer 420, the first material layer 450 is connected with the insulation layer 420 via the first trenches 414. Next, in Step S1170, a second material M2 is deposited on the device layer 410. Referring to FIG. 26G and FIG. 27, in the embodiment, the second material M2 is polycrystalline silicon, for example, which is deposited on the device layer 410 by the plasma enhanced chemical vapor deposition (PECVD) process and fills the first trenches 414, in which the second material M2 in the first trenches 414 is surrounded by the first material layer 450. Because the device layer 410 and the inner sides of the first trenches 414 are all covered by the first material M1, the second material M2 in the first trenches 414 is surrounded by the first material layer 450.

Then, in Step S1180, the device layer 410 is polished. As shown in FIG. 26H and FIG. 27, in the embodiment, the device layer 410 is polished by a chemical mechanical polishing (CMP) method, thereby removing the second material M2 and the first material M1 outside the first trenches 414. As a result, the device layer 410 exposes the surface 412 thereof, and the first trenches 414 are filled with the first material M1 and the second material M2, wherein the first material M1 in the first trenches 414 is a portion of the aforementioned first material layer 450. Thereafter, in Step S1190, the second material M2 is deposited. Referring to FIG. 26I and FIG. 27, in the embodiment, the second material M2 is deposited on the device layer 410 by the plasma enhanced chemical vapor deposition (PECVD) process. At the point, the first trenches 414 are already filled with the first material M1 and the second material M2. Thus, the second material M2 deposited on the device layer 410 and the second material M2 filled in the first trenches 414 constitute a second material layer 460.

By performing the foregoing steps, the preliminary treatment on the first substrate 400 is completed. Next, a second substrate 500 is provided. Recesses 510 are formed on the second substrate 500. In the embodiment, a process of providing the second substrate 500 and forming the recesses 510 on the second substrate 500 includes the following steps: first, in Step S1200, a second substrate 500 is provided. Referring to FIG. 26J and FIG. 27, in the embodiment, the second substrate 500 may be a silicon wafer, but the disclosure is not limited thereto. Then, in Step S1210, a first surface 502 of the second substrate 500 is etched to form a plurality of second trenches 520. Referring to FIG. 26K and FIG. 27, in the embodiment, the second trenches 520 are formed on the first surface 502 of the second substrate 500 by the inductively coupled plasma (ICP) etching process (dry etching process).

Thereafter, in Step S1220, the second trenches 520 are filled with an insulating material 504. Referring to FIG. 26L and FIG. 27, in the embodiment, the insulating material 504 may be glass, but the disclosure is not limited thereto. The insulating material 504 fills the second trenches 520 to form a plurality of electrical channels on the second substrate 500. Lastly, in Step S1230, the second substrate 500 is etched to form the recesses 510. Referring to FIG. 26M and FIG. 27, in the embodiment, the recesses 510 are formed on the first surface 502 of the second substrate 500 by the inductively coupled plasma (ICP) etching process. Therefore, the recesses 510 provide space for the mass 112 (as shown in FIG. 24) of the composite MEMS device 100 to vibrate.

By performing the foregoing steps, the preliminary treatment on the second substrate 500 is completed. Following the above, in Step S1240, the first substrate 400 and the second substrate 500 are bonded to each other. Referring to FIG. 26N and FIG. 27, in the embodiment, the first substrate 400 and the second substrate 500, which have been preliminarily treated, are bonded to each other by wafer-to wafer bonding process such as an anodic bonding process, but the disclosure is not limited thereto. When the first substrate 400 and the second substrate 500 are bonded to each other, the device layer 410 of the first substrate 400 faces to the recesses 510 of the second substrate 500, and the first substrate 400 is connected with the first surface 502 of the second substrate 500.

At last, after the step of bonding the first substrate 400 and the second substrate 500, a portion of the second material layer 460 in the first trenches 414 is removed to form slots penetrating the device layer 410. The step further includes the following steps: first, in Step S1250, another surface 432 of the handle layer 430 of the first substrate 400 is polished to thin the thickness of the handle layer 430. Referring to FIG. 26O and FIG. 27, in the embodiment, after the first substrate 400 and the second substrate 500 are bonded to each other, the another surface 432 of the handle layer 430 of the first substrate 400 is thinned by the chemical mechanical polishing (CMP) method.

Then, in Step S1260, the handle layer 430 and the insulation layer 420 are removed to expose the first material layer 450 and the second material layer 460 in the first trenches 414. Referring to FIG. 26P and FIG. 27, in the embodiment, the handle layer 430 and the insulation layer 420 are removed from the first substrate 400 by the inductively coupled plasma (ICP) etching process (dry etching process) and a buffer oxide etching (BOE) process (wet etching process). Accordingly, a portion of the first material layer 450 filled on the inner sides of the first trenches 414 and a portion of the second material layer 460 surrounded by the first material layer 450 are exposed.

Then, in Step S1270, a stopper layer 470 is formed on the device layer 410 of the first substrate 400. Referring to FIG. 26Q and FIG. 27, in the embodiment, a material of the stopper layer 470 may be silicon nitride, which is deposited on the device layer 410 by the plasma enhanced chemical vapor deposition (PECVD) process. Thereafter, in Step S1280, the stopper layer 470 is patterned. Referring to FIG. 26R and FIG. 27, the stopper layer 470 is exposed and developed on a photoresist by the lithography process, and openings 472 are formed on the stopper layer 470 by wet etching using the phosphoric acid solution, wherein the openings 472 correspond to the second material layer 460 filled in the first trenches 414.

Following that, in Step S1290, the device layer 410 is etched by using the patterned stopper layer 470. Referring to FIG. 26S and FIG. 27, in the embodiment, the openings of the patterned stopper layer 470 correspond to the second material layer 460 filled in the first trenches 414. Thus, the device layer 410 is etched by the inductively coupled plasma (ICP) etching process (dry etching process) with use of the patterned stopper layer 470, thereby removing a portion of the second material layer 460 in the first trenches 414 to form slots penetrating the device layer 410. Accordingly, the inner sides of the first trenches 414 are covered by the first material layer 450 and the second material layer 460. Finally, in Step S1300, the patterned stopper layer 470 is removed. With reference to FIG. 26T and FIG. 27, in the embodiment, after the slot penetrating the device layer 410 are formed by removing a portion of the second material layer 460 in the first trenches 414, a wet etching process using an etching solution such as phosphoric acid solution is performed to remove the patterned stopper layer 470 from the device layer 410. Accordingly, the composite MEMS device 100 is completed.

With reference to FIG. 11A, FIG. 24, FIG. 25, and FIG. 26T, after the slots penetrating the device layer 410 are formed by removing a portion of the second material layer 460 in the first trenches 414 of the first substrate 400, a middle portion of the device layer 410 forms the mass 112 of the vibrating unit 110 of the composite MEMS device 100 illustrated in FIG. 11A, FIG. 24, and FIG. 25, wherein the first material layer 450 is arranged on two sides of the middle portion of the device layer 410 as the first material 120 on the first surface S1 and the second surface S2 of the mass 112 in FIG. 11A and FIG. 24, and the second material layer 460 is arranged on the first material layer 450 and the bottom of the middle portion of the device layer 410 as the second material 130 on the first material 120 and the third surface S3 of the mass 112 in FIG. 11A and FIG. 24.

In addition, the first material layer 450 (equivalent to the first material 120 in FIG. 11A and FIG. 24) is arranged on the first surface S1 and the second surface S2 of the mass 112. When the temperature changes, the variation direction of the Young's modulus of the first material layer 450 is opposite to the variation direction of the Young's modulus of the mass 112. Moreover, the second material layer 460 (equivalent to the second material 120 in FIG. 11A and FIG. 24) is a conductive material disposed on the first material layer 450 and extended to the third surface S3 of the mass 112, in which the second material layer 460 is electrically connected with the third surface S3 of the mass 112.

Furthermore, the first material layer 450 (equivalent to the first material 120) covers the entirety of the first surface S1 and the entirety of the second surface S2, wherein the mass 112 has the section width w1, and the first material layer 450 covering the entire first surface S1 or the entire second surface S2 has the section width w2, as shown in FIG. 11. In order to prevent the resonance frequency of the vibrating unit 110 from changing with the temperature, the temperature coefficient of frequency (TCf) of the vibrating unit 110 has to be zero TCf, as shown in FIG. 2. Thus, it is known from the first embodiment that the section width w1 of the mass 112 and the section width w2 of the first material layer 450 (equivalent to the first material 120) have to satisfy the aforementioned Equation (11):

$$\frac{w_1^3}{6w_1^2 \cdot w_2 + 2w_2^3} = C_T \qquad \text{Equation (11)}$$

wherein $C_T$ is a temperature constant. It can be concluded from the first embodiment that the temperature coefficient of frequency (TCf) of the vibrating unit 110 becomes zero TCf only when the section width w1 of the mass 112 and the section width w2 of the first material 120 (equivalent to the first material layer 450 here) both satisfy the Equation (11). When the variation direction of the Young's modulus of the mass 112 is opposite to the variation direction of the Young's modulus of the first material 120, the section width w1 of the mass 112 and the section width w2 of the first material 120 both have to satisfy the Equation (11), so as to adjust the temperature coefficient of the frequency of the vibrating unit 110 to be zero TCf and consequently the resonance frequency of the vibrating unit 110 does not change with the temperature.

Likewise, the composite electrode 140, as shown in FIG. 24, may be formed on two side portions of the device layer 410. For details and components thereof, please refer to the descriptions of the first embodiment. Based on the above, the disclosure provides the manufacturing method for manufacturing the composite MEMS device that is not easily affected by temperature.

In conclusion, the composite MEMS device of the disclosure includes the vibrating unit that oscillates along the first axis, wherein the mass or the span of the flexure, serving as the stiffness element, of the vibrating unit has the first surface and the second surface that are arranged along the first axis, and the first material is disposed on the first surface and the second surface to adjust the overall temperature coefficient of the frequency of the vibrating unit. The second material is disposed on the first material and the third surface that connects the first surface and the second surface, wherein the second material is a conductive material electrically connected to the third surface or electrically connected to the connector of the span. Thus, the composite MEMS device has high stability and high accuracy. In addition, the manufacturing method for manufacturing the composite MEMS device, provided by the disclosure, is to sequentially deposit the first material and the second material on the device layer of the first substrate and form the first material and the second material in the first trenches, bond the first substrate to the second substrate with the recesses, and remove a portion of the second material layer in the first trenches to form slots penetrating the device layer, so as to form the mass of the vibrating unit of the composite MEMS device. The composite MEMS device manufactured by the manufacturing method of the disclosure is not easily affected by temperature.

It will be apparent to those skilled in the art that various modifications and variations can be made to the disclosed embodiments without departing from the scope or spirit of the disclosure. In view of the foregoing, it is intended that the disclosure covers modifications and variations of the disclosure provided that they fall within the scope of the following claims and their equivalents.

What is claimed is:

1. A composite micro-electro-mechanical-system (MEMS) apparatus, comprising:
a vibrating unit oscillating along a first axis, wherein the vibrating unit comprises:
a stiffness element comprising a first surface, a second surface, and a third surface, wherein the first surface faces toward a first direction of the first axis and the second surface faces toward a second direction of the first axis, wherein the first direction is opposite to the second direction, and the third surface connects the first surface and the second surface;
a first material disposed on the first surface and the second surface of the stiffness element; and
a second material being a conductive material disposed on the first material and extending to the stiffness element, wherein the second material is electrically connected to the stiffness element,
wherein, when a temperature changes, a variation direction of a Young's modulus of the first material is opposite to a variation direction of a Young's modulus of the stiffness element.

2. The composite MEMS apparatus according to claim 1, wherein the second material extends to the third surface of the stiffness element, wherein the second material is electrically connected to the third surface of the stiffness element.

3. The composite MEMS apparatus according to claim 1, wherein a material of the stiffness element comprises Si and the first material comprises SiO2.

4. The composite MEMS apparatus according to claim 3, wherein the second material comprises polycrystalline silicon.

5. A composite micro-electro-mechanical-system (MEMS) apparatus, comprising:
a vibrating unit comprising:
a mass being a stiffness element oscillating along a first axis and comprising a first surface, a second surface, and a third surface, wherein the first surface faces toward a first direction of the first axis and the second surface faces toward a second direction of the first axis, wherein the first direction is opposite to the second direction, and the third surface connects the first surface and the second surface; and
a flexure connected to the mass;
a first material disposed on the first surface and the second surface of the mass; and
a second material being a conductive material disposed on the first material and extending to the mass, wherein the second material is electrically connected to the mass,
wherein, when a temperature changes, a variation direction of a Young's modulus of the first material is opposite to a variation direction of a Young's modulus of the mass.

6. The composite MEMS apparatus according to claim 5, wherein the second material extends to the third surface of the mass, wherein the second material is electrically connected to the third surface of the mass.

7. The composite MEMS apparatus according to claim 5, wherein a material of the mass comprises Si and the first material comprises SiO2.

8. The composite MEMS apparatus according to claim 7, wherein the second material comprises polycrystalline silicon.

9. The composite MEMS apparatus according to claim 7, wherein the first material covers an entirety of the first surface and an entirety of the second surface, and a section width (w1) of the mass and a section width (w2) of the first material satisfy the following equation:

$$\left(\frac{w_1^3}{6w_1^2 \cdot w_2 + 2w_2^3}\right) = C_T,$$

wherein CT is a temperature constant.

10. The composite MEMS apparatus according to claim 5, further comprising:
an electrode disposed beside two sides of the mass along the first axis;
a third material disposed on an outer surface of the electrode along a vibrating direction of the first axis; and
a fourth material being a conductive material disposed on the third material and extending to a bottom surface of the electrode,
wherein the third material comprises SiO2 and the fourth material comprises polycrystalline silicon.

11. The composite MEMS apparatus according to claim 5, further comprising:
an anchor, wherein the flexure connects the anchor and at least one node of the mass.

12. A composite micro-electro-mechanical-system (MEMS) apparatus, comprising:
a vibrating unit comprising:
a mass oscillating along a first axis; and
a flexure being a stiffness element connected to the mass, the flexure comprises a span and a connector connected to the span, wherein the span comprises a first surface, a second surface, and a third surface, wherein the first surface faces toward a first direction of the first axis and the second surface faces toward a second direction of the first axis, wherein the first direction is opposite to the second direction, and the third surface connects the first surface and the second surface;
a first material disposed on the first surface and the second surface; and
a second material being a conductive material disposed on the first material and extending to the flexure, wherein the second material is electrically connected to the flexure,
wherein, when a temperature changes, a variation direction of a Young's modulus of the first material is opposite to a variation direction of a Young's modulus of the flexure.

13. The composite MEMS apparatus according to claim 12, wherein the second material extends to the third surface of the span, wherein the second material is electrically connected to the third surface of the span.

14. The composite MEMS apparatus according to claim 12, wherein the second material extends to the connector, wherein the second material is electrically connected to the connector.

15. The composite MEMS apparatus according to claim 12, wherein a material of the flexure comprises Si and the first material comprises SiO2.

16. The composite MEMS apparatus according to claim 15, wherein the second material comprises polycrystalline silicon.

17. The composite MEMS apparatus according to claim 12, wherein the mass is a frame.

18. A manufacturing method of a composite MEMS apparatus, the manufacturing method comprising:
   providing a first substrate, wherein the first substrate comprises a device layer, an insulation layer, and a handle layer;
   etching the device layer by using a patterned hard mask to form a plurality of first trenches and expose a portion of a surface of the insulation layer;
   depositing a first material on the device layer to form a first material layer conformal with the device layer after removing the patterned hard mask, wherein the first material is formed on an inner side of each of the first trenches;
   depositing a second material on the device layer to fill the first trenches, wherein the second material in the first trenches is surrounded by the first material layer;
   polishing the device layer to remove the second material and to remove the first material outside the first trenches;
   depositing the second material to form a second material layer which connects the second material filled in the first trenches;
   providing a second substrate and forming a recess on the second substrate;
   bonding the first substrate and the second substrate to each other, wherein the device layer of the first substrate faces to the recess of the second substrate; and
   removing a portion of the second material layer in the first trenches to form slots penetrating the device layer, so as to form a vibrating unit of the composite MEMS apparatus, the vibrating unit comprising a mass and a flexure, wherein the mass is a stiffness element oscillating along a first axis and comprises a first surface, a second surface, and a third surface, wherein the first surface faces toward a first direction of the first axis and the second surface faces toward a second direction of the first axis, wherein the first direction is opposite to the second direction, and the third surface connects the first surface and the second surface;
   wherein the first material layer is arranged on the first surface and the second surface of the mass, and the second material layer is a conductive material that is arranged on the first material layer and extends to the third surface of the mass, wherein a variation direction of a Young's modulus of the first material layer is opposite to a variation direction of a Young's modulus of the mass when a temperature changes, and wherein the second material layer is electrically connected to the third surface of the mass.

19. The manufacturing method according to claim 18, wherein the first material layer covers the entirety of the first surface and the entirety of the second surface, and a section width (w1) of the mass and a section width (w2) of the first material layer satisfy the following equation:

$$\left(\frac{w_1^3}{6w_1^2 \cdot w_2 + 2w_2^3}\right) = C_T,$$

wherein $C_T$ is a temperature constant.

20. A manufacturing method of a composite MEMS apparatus, the manufacturing method comprising:
   providing a first substrate, wherein the first substrate comprises a device layer, an insulation layer, and a handle layer;
   etching the device layer by using a patterned hard mask to form a plurality of first trenches and expose a portion of a surface of the insulation layer;
   depositing a first material on the device layer to form a first material layer conformal with the device layer after removing the patterned hard mask, wherein the first material is formed on an inner side of each of the first trenches;
   depositing a second material on the device layer to fill the first trenches, wherein the second material in the first trenches is surrounded by the first material layer;
   polishing the device layer to remove the second material and to remove the first material outside the first trenches;
   depositing the second material to form a second material layer which connects the second material filled in the first trenches;
   providing a second substrate and forming a recess on the second substrate;
   bonding the first substrate and the second substrate to each other, wherein the device layer of the first substrate faces to the recess of the second substrate; and
   removing a portion of the second material layer in the first trenches to form slots penetrating the device layer, so as to form a vibrating unit of the composite MEMS apparatus, the vibrating unit comprising a mass and a flexure, wherein the mass oscillates along a first axis; and the flexure is a stiffness element connected to the mass, the flexure comprises a span and a connector connected to the span, wherein the span comprises a first surface, a second surface, and a third surface, wherein the first surface faces toward a first direction of the first axis and the second surface faces toward a second direction of the first axis, wherein the first direction is opposite to the second direction, and the third surface connects the first surface and the second surface,
   wherein the first material layer is disposed on the first surface and the second surface, and the second material layer is a conductive material disposed on the first material layer and extends to the flexure, wherein the second material layer is electrically connected to the third surface of the flexure,
   wherein, when a temperature changes, a variation direction of a Young's modulus of the first material is opposite to a variation direction of a Young's modulus of the flexure.

21. The manufacturing method according to claim 20, wherein, after the step of removing a portion of the second material layer in the first trenches to form slots penetrating the device layer, the first substrate and the second substrate form the vibrating unit of the composite MEMS apparatus, the first material layer covers the entirety of the first surface and the entirety of the second surface, and a section width (w1) of the flexure and a section width (w2) of the first material layer satisfy the following equation:

$$\left(\frac{w_1^3}{6w_1^2 \cdot w_2 + 2w_2^3}\right) = C_T,$$

wherein $C_T$ is a temperature constant.

\* \* \* \* \*